United States Patent [19]
Bremner et al.

[11] Patent Number: 6,090,147
[45] Date of Patent: Jul. 18, 2000

[54] COMPUTER PROGRAM MEDIA, METHOD AND SYSTEM FOR VIBRATION AND ACOUSTIC ANALYSIS OF COMPLEX STRUCTURAL-ACOUSTIC SYSTEMS

[75] Inventors: Paul M. Bremner, Del Mar, Calif.; Robin S. Langley, Cambridge, United Kingdom

[73] Assignee: Vibro-Acoustics Sciences, Inc., San Diego, Calif.

[21] Appl. No.: 08/986,037

[22] Filed: Dec. 5, 1997

[51] Int. Cl.[7] .................................................. G01B 5/28
[52] U.S. Cl. ................................... 703/1; 703/7; 73/594; 73/579; 702/39; 702/108
[58] Field of Search ..................................... 364/578, 512; 73/570, 1.82, 594, 579; 702/56, 39, 108; 395/500.01, 500.27, 500.28; 381/124

[56] References Cited

U.S. PATENT DOCUMENTS

| | | | |
|---|---|---|---|
| 5,163,015 | 11/1992 | Yokota | 364/578 |
| 5,361,636 | 11/1994 | Farstad et al. | 73/592 |

OTHER PUBLICATIONS

Lee, K., Ghosh, S., "Small Deformation Multi–scale Analysis of Heterogeneous Materials With the Voronoi Cell Finite Element Model and Homogenization Theory", Computational Materials Science, vol. 7, Issue 1–2, pp. 131–146, Dec. 1996.

Zhaohui Sun, Jincai Sun, Chong Wang and Yang Dai, "Dynamic Vibration Absorbers Used for Increasing the Noise Transmission Loss of Aircraft Panels", Applied Acousitics, vol. 48, No. 4 pp. 311–321, Aug. 1996.

Ghosh, S., Lee, K., and Moorthy, S., "Multiple Scale Analysis of Heterogeneous Elastic Structures Using Homogenization Theory and Voronoi Cell Finite Element Method", International Journal of Solids and Structures, vol. 32, No. 1, pp. 27–66, Jan. 1995.

Ghosh, S., Moorthy, S., "Elastic–Plastic Analysis of Heterogeneous Micro Structures Using the Voronoi Cell Finite Element Method", Computer Methods in Applied Mechanics and Engineering, vol. 121, pp. 373–409, Mar. 1995.

Ghosh, S. and Moorthy, S., "A method for Analysis of Arbitrary Composite and Porous Micro Structures with Voronoi Cell Finit Elements", International Journal for Numerical Methods in Engineering, vol. 36, No. 14, pp. 2363–2398, Jul. 1996.

Galuta et al, "Combined Boundary Element and Finite Element Analysis of Composite Box and Girder Bridges", Computers & Structures, vol. 57, No. 3, pp. 427–437, 1995.

Kopuz et al., "Integrated FEM/BEM Approach to the Dynamic and Acoustic Analysis of Plate Structures", Engineering Analysis with Boundary Elements, vol. 19, 1996, pp. 269–277.

Hynna et al., "Prediction of Structure–Bourne Sound Transmission in Large Welded Ship Structures Using Statistical Energy Analsysis", Journal of Sound and Vibration, vol. 180 (4), pp. 583–607, Mar. 1995.

Bouzit et al., "Localization of Vibration in Disordered Multi–span Beams with Damping", Journal of Sound and Vibration, vol. 187, Issue 4, pp. 625–648, Nov. 1995.

(List continued on next page.)

*Primary Examiner*—Kevin J. Teska
*Assistant Examiner*—Douglas W. Sergent
*Attorney, Agent, or Firm*—Lyon & Lyon LLP

[57] ABSTRACT

A computer program media embodies a program of instructions executable by a computer to perform method steps for simulating the dynamic response of a structural-acoustic system over a broad range of frequencies. The method includes the steps of wavenumber partioning a design of the structural-acoustic system into large-scale behavior and small-scale behavior; determining the large-scale behavior; and determining the small-scale behavior.

32 Claims, 12 Drawing Sheets

OTHER PUBLICATIONS

Kishimoto et al., "Energy Flow in Modelling of Interconnected Structures: A Deterministic Foundation for Statistical Energy Analysis", Journal of Sound and Vibration, vol. 186, Issue 3, pp. 404–445, Sep. 1995.

Missaoui et al., "Free and Forced Vibration of a Cylidrical Shell with a Floor Partition", Journal of Sound and Vibration, vol. 190, Issue 1, pp. 21–40, 1996.

The Journal of the Acoustical Society of America, vol. 100, No. 4, Pt. 2, Oct. 1996.

Vibro–Acoustic Sciences, Inc. Newsletter, vol. 3, No. 1, Nov. 1996.

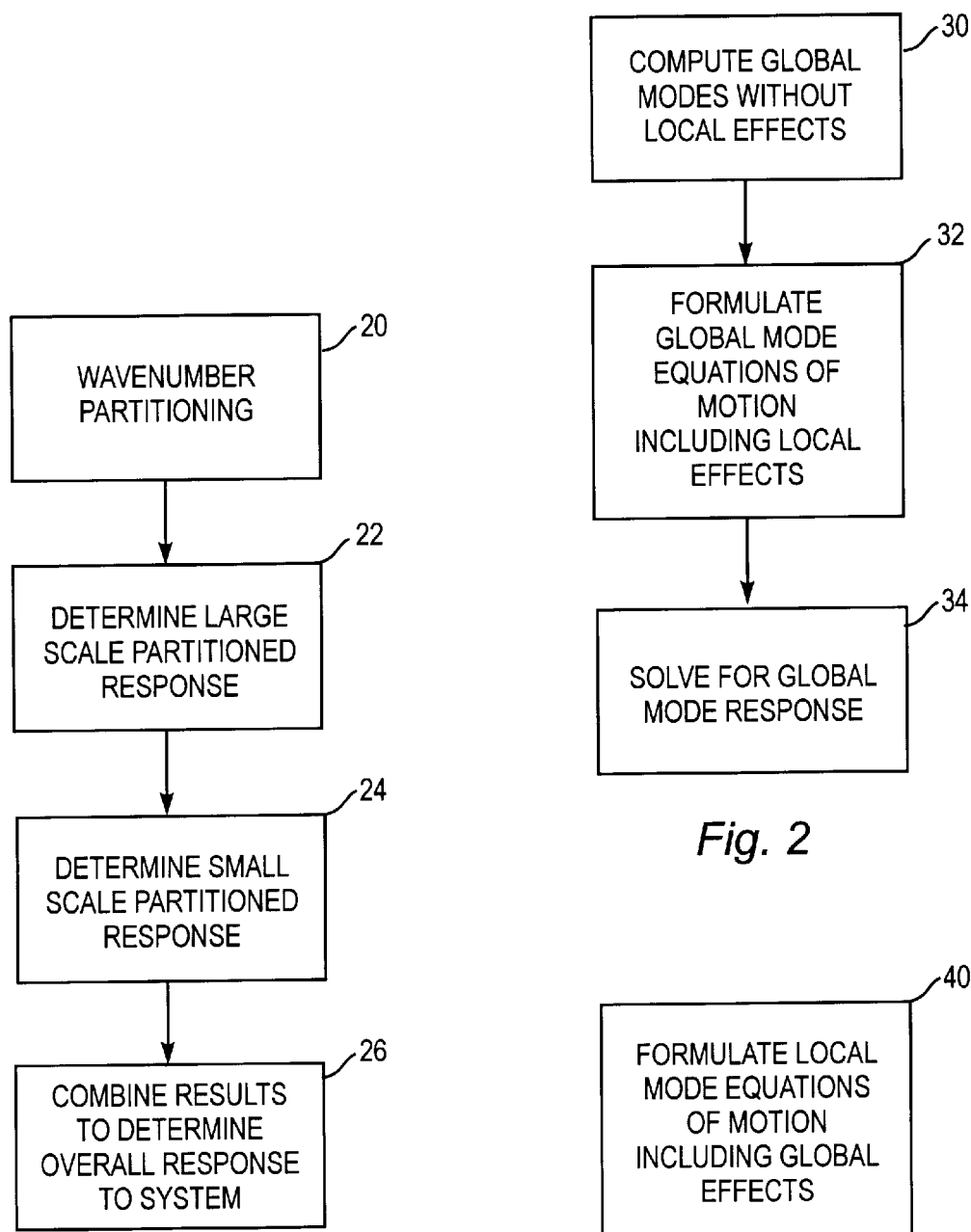
Fig. 1
Fig. 2
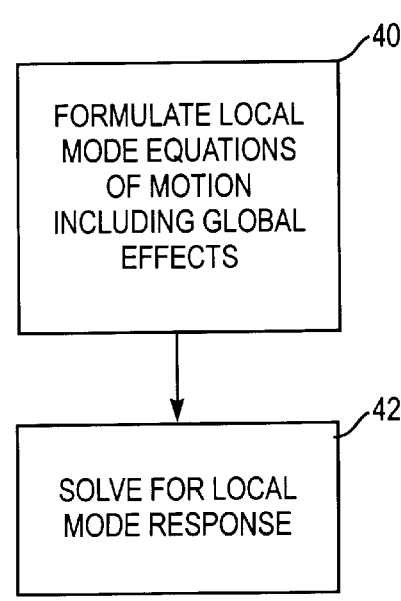
Fig. 3

| EXAMPLE NO | MODEL DENSITY RATIO $V_R = V_2/V_1$ | NUMBER OF HIERARCHICAL TERMS | |
|---|---|---|---|
| | | ROD 1 | ROD 2 |
| 1 | 12.3 | 10 | 12 |
| 2 | 0.117 | 20 | 10 |
| 3 | 1.723 | 7 | 12 |

COMPUTER PROGRAM MEDIA, METHOD AND SYSTEM FOR VIBRATION AND ACOUSTIC ANALYSIS OF COMPLEX STRUCTURAL-ACOUSTIC SYSTEMS

BACKGROUND OF THE INVENTION

I. Field of the Invention

This invention relates, in general, to computer program media, methods, and systems for engineering analysis purposes and, in particular, to computer program media, methods and systems for simulating the dynamic response of a complex structural-acoustic system over a broad range of frequencies and wavelengths.

II. Description of Related Art

The analysis of the response of a coupled structural-acoustic system to external excitation becomes increasingly difficult with increasing excitation frequency. The main reason for this lies in the fact that the wavelength of the system deformation reduces with increasing frequency, making it difficult to devise a precise mathematical model that can adequately capture the complex response pattern. Traditionally, finite element analysis (FEA) has been used as an analysis method for low frequency vibrations while statistical energy analysis (SEA) has been used to analyze high frequency vibrations.

FEA Las not been used to predict high frequency vibrations because it is generally considered that approximately eight elements must be used to adequately resolve each structural wavelength, leading to unfeasibly large models at higher frequencies. Another difficulty with FEA is that the system response becomes increasingly sensitive to geometrical imperfections as the wavelength of the response decreases, so that even a very detailed deterministic mathematical model based on the nominal system properties may not yield a reliable response prediction.

A totally different, more approximate technique, SEA, is used to simulate the dynamic response of complex structural-acoustic system at high frequencies. With SEA, a complex system is modeled as a collection of subsystems, each of which is assigned a single response variable corresponding to the vibrational energy. It is generally recognized that for successful application of SEA, in addition to other conditions, each subsystem must ideally contain a number of resonant modes over the analysis band of interest. One implication of this condition is that the wavelength of the subsystem deformation must be of the same order as, or less than, the dimensions of the subsystem. In some cases this requirement may be only partially met: for example, in-plane waves in a plate are generally of much longer wavelength than bending waves, so that while the bending motion might meet the SEA requirement, the in-plane motion might not. This problem of both short and long wavelength deformations within a structure is exacerbated with decreasing frequency, i.e., lower frequencies.

Consequently, an approach for estimating the dynamic response of a structural-acoustic system at low frequency ranges has not been successful for estimating the dynamic response at high frequency ranges and vice versa. A need therefore exists for a single system or approach that represents the dynamic response of a structural-acoustic system at low frequencies and high frequencies, i.e., a broad range of frequencies.

A recent approach to the vibration analysis of complex systems is fuzzy structure theory. In this approach, a system is modeled as a master structure with a set of uncertain or fuzzy attachments. For example, the master structure might represent a ship hull and the fuzzy attachments might be internal systems consisting of items such as piping and mechanical or electrical equipment. A key result of fuzzy structure theory is that the attached items act mainly to provide damping to the master structure and, furthermore, the level of this damping is surprisingly independent of the dissipation factor of the attachments.

However, fuzzy structure theory is unproved for vibration analysis of complex systems; it is only known to have been applied to relatively simple systems. Moreover, the method has not been widely adopted in the engineering community due to several deficiencies. Specifically, fuzzy structure theory does not handle the transfer of loads on a secondary structure as equivalent loads on a primary structure in a generic way, and does not provide a generally applicable means for recovering a quantitative estimate of secondary structure response. Additionally, the mathematical basis of fuzzy structure theory has not been sufficiently fundamental for it to be integrated in unambiguous way into both existing low frequency deterministic analyses—such as finite element analysis—or into high frequency statistical analysis— such as SEA.

SUMMARY OF THE INVENTION

These problems and others are overcome by the present invention which includes a computer program medium, method and system for estimating the dynamic response of a complex structural-acoustic system over a broad range of frequencies.

An aspect of the present invention includes computer program media, embodying a program of instructions executable by a computer to perform method steps for simulating the dynamic response of a complex structural-acoustic system over a broad range of frequencies. The method includes the steps of wavenumber partitioning the complex system into a global response part and a local response part. The global response part relates to long wavelength deformations, large-scale motion of the global aspects. This response part of the dynamic response is solved before the local response part, and is solved deterministically, in more detail, and with more accuracy than the local response part. The local response part relates to short wavelength deformations, small-scale motion of the local aspects. This part of the response is generally solved statistically, in less detail and with less accuracy than the global aspects. The method further includes the steps of determining the global response and determining the local response.

Another aspect of the present invention includes a method for simulating the dynamic response of a structural-acoustic system over a broad range of frequencies, the method using a programmable digital computer system. The method includes the steps of storing in memory a computer design of the structural-acoustic system to be simulated and wavenumber partitioning the design into a global equation of motion and a local equation of motion. The method also includes the steps of computing the global equation of motion and the local equation of motion.

A further aspect of the present invention involves a computer based system for simulating the dynamic response of a structural-acoustic system over a broad range of frequencies. The system includes memory means for storing a set of data that represents a computer design of the structural-acoustic system to be simulated. The system also has means for wavenumber partitioning the computer design of the structural-acoustic system to be simulated into a global equation of motion and a local equation of motion. The system also includes programmed data processor means coupled to memory means for computing global equation of motion and local equation of motion.

BRIEF DESCRIPTION OF THE DRAWINGS

These and other features of the invention will now be described with reference to tie drawings of a preferred embodiment, which are intended to illustrate and are not to limit the invention, and in which:

FIG. 1 is an operational flow diagram illustrating a method of simulating the dynamic response of a structural acoustic system in accordance with an embodiment of the invention;

FIG. 2 is an operational flow diagram illustrating the steps involved in determining the global response of the system;

FIG. 3 is an operational flow diagram illustrating the steps involved in determining the local response of the system;

FIG. 15 is a schematic, drawing of an example computer system that present invention may be implemented with.

DETAILED DESCRIPTION OF PREFERRED EMBODIMENTS

Figure 4:
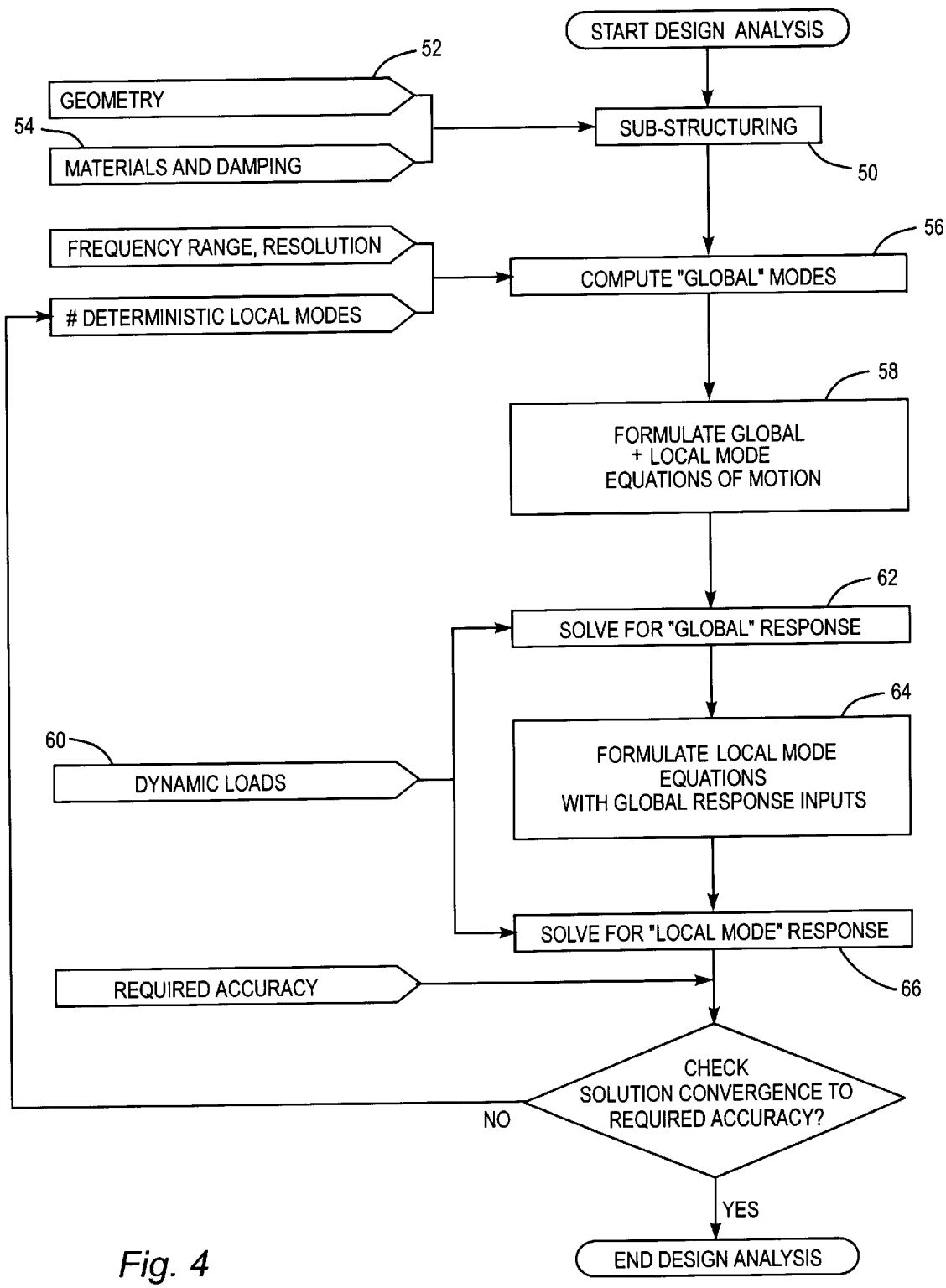
FIG. 4 is an operational flow diagram illustrating a method of simulating the dynamic response of a structural acoustic system in accordance with an additional embodiment of the invention.

With reference to FIG. 1, a method for simulating the dynamic response of a complex structural-acoustic system over a broad range of frequencies in accordance with the present invention will now be described generally. FIG. 1 is a high level flow diagram illustrating the process. In a step 20, a function of the estimated dynamic response of a complex structural-acoustic system is wavenumber partitioned into two functions: a global equation of motion, or a global mode part, and a local equation of motion, or local mode part. These equations of motions are discussed in much greater detail below in Sections 1–5, and wavenumber partitioning is described in greater detail in section 1.2 below. The global mode part relates to long wavelength deformations in the system, and large-scale or overall motion of the system. The local response part relates to short wavelength deformations, and small-scale or detailed motion in the structural-acoustic system.

In a step 22, a global mode or large-scale response of the system is determined. The global mode response is solved deterministically, in more detail, and with more accuracy than the local mode response. In a step 24, a local mode or small-scale response is determined. The local response part relates to short wavelength deformations, and small-scale or detailed motion in the structural-acoustic system. This part of the response is generally solved statistically, in less detail and with loss accuracy than the global response part.

One reason for generally solving the local response part statistically is because of the high number of local modes present in a complex structural-acoustic system. Solving the behavior of a high number of local modes deterministically is extremely difficult and complicated. Another reason for solving the local part statistically is because of the uncertain behavior of the local modes. This uncertain behavior at each local mode makes it difficult to accurately predict the behavior at each local mode.

In a step 26, the responses are combined so as to form a total dynamic response. It should be noted, in certain circumstances, a total dynamic response may not be desired. For example, if global behavior of the system is being observed, or relative local behavior at the local modes is being observed, combining the responses may not be desired.

FIG. 2 illustrates the steps involved in determining the global mode response of step 22 (FIG. 1) in more detail. These steps are developed in much greater detail in Section 2 below. In a step 30, global modes are computed without considering any contribution or effects from the local modes. Because this is not an accurate estimation of the global system's dynamic response, in a step 32, the global equations of motion are formulated, taking into consideration approximate impedance, and local load effects or contributions of local modes (See Sections 2.1 and 2.2 for more detail). The impedance effects include an approximate effective dynamic stiffness contribution from the local modes. The approximate effective dynamic stiffness contribution is treated as effective global mode damping and/or effective global mode mass. The local load effects include an approximate effective load contribution that represents the loads applied to the local modes. In a step 34, the global mode response is solved. This step is developed in greater detail in Section 2.3.

FIG. 3 illustrates the steps involved in determining the local mode response of step 24 (FIG. 1) in more detail. These steps are developed in much greater detail in Section 3 below. In a step 40, the local equations of motion are formulated. This step includes formulating power input effects on the local modes from the global modes (See Section 3.2). The power input effects include an effective power input arising from the global mode response. In a step 42, the local mode response is solved. This step is developed in greater detail in Section 3.3.

FIG. 4 illustrates a method for simulating or analyzing the dynamic response of a complex structural-acoustic systems over a broad range of frequencies in accordance with an additional embodiment of the invention. This method is iterative in that the method repeats until a response solution converges within a predetermined accuracy. Analyzing the dynamic response of a complex structural-acoustic system requires a design or prototype of the structural-acoustic system. Preferably, this design has a three-dimensional geometry design and is created using a computer-aided drafting (CAD) method or some other finite element (FE) method. In a step 50, the three-dimensional design representing the structural-acoustic system is received and substructured into a number of subsystems. These subsystems comprise local mode groups defined by physical substructure boundaries. The three-dimensional design includes a geometry 52 and material and damping values 54 that are received during this step. The substructuring process may repeat as an iterative process. Moreover, the substructuring process may be an iterative process alone, or in combination with the iterative process of the present method discussed more fully below. An iterative substructuring process is desirable because of the uncertainty and infinite number of ways a complex structure can be substructured. The design is also wavenumber partitioned in this step in the manner discussed above with respect to step 20 of FIG. 1.

Steps 56–66 are the same as steps 30–34 of FIG. 2 and 40–42 of FIG. 3, except for the following. In a step 56, where the global modes are computed, the following inputs are received: desired frequency range, resolution, and deterministic local mode number input.

The deterministic local mode number input is an adjustable complexity parameter that controls to what extent the local mode behavior is determined statistically. By adjusting this complexity parameter, all or some of the local mode behavior can be determined statistically. In other words, part of the local mode behavior may be determined deterministically during the determination of the global mode behavior. Adjusting this complexity parameter varies the number of local mode degrees of freedom to be included in the global mode analysis in an iterative way to allow convergence in solution to given accuracy requirements. The complexity parameter partially determines how many times the analysis repeats itself. As discussed below, when the solution converges to a required accuracy, the analysis stops. Of course, this parameter can be varied so that no convergence occurs.

In steps 58–62, where the global mode response is determined and the statistical local mode equations are formulated, dynamic load inputs are received.

After step 66, where the local mode response is solved, a check is made for whether the local mode response solution converges to a required received accuracy input. If the solution does converge to a required accuracy, or if no convergence is selected, the design analysis ends. However, if the solution does not converge to the required accuracy, global mode response and local mode response are redetermined, i.e., steps 56–66 are repeated.

It should be noted, steps of determining the global mode response may also be repeated in an iterative process.

The following five sections focus on the theory and mathematics, especially a development of the mathematics, used in accordance with an embodiment of the present invention. In section 1, the equations of motion of a general structural-acoustic system are developed. This includes dividing the response into the aforementioned global component and local component. In section 2, the prediction of the global response is described. In the third section, an application of Statistical Energy Analysis (SEA) to the prediction of the local response is described. In the fourth section, a summary of the approach is presented. In the fifth section, an example application of the approach is given.

1. EQUATIONS OF MOTION 1.1 GENERAL FORM OF THE EOM FOR BUILT-UP SYSTEMS

The equations of motion of a general built-up system which is composed of a number of subsystems such as beams, plates, shells and acoustic volumes can be formulated by using the Lagrange-Rayleigh-Ritz approach, in which the system response is expressed in terms of a complete set of admissible functions. With this approach, the three components of the system displacement $u=(u_1\ u_2\ u_3)^T$ at a general location $x=(x_1\ x_2\ x_3)^T$ are written in the form $$u(x,t) = \sum_{n=1}^{\infty} q_n(t)\phi_n(x), \quad (1)$$

where $\phi_n(x)$ represents the nth admissible function, and $q_n(t)$ is the associated degree of freedom (or "generalized coordinate") which constitutes the time dependent amplitude of the admissible function. Many different types of admissible functions may be selected—for example, each function may extend smoothly over the whole system, or alternatively each function may be restricted to a limited region of the system, as in a finite element method (FEM); the main stipulation is that the functions must have an appropriate degree of continuity and must form a complete set under the prescribed natural boundary conditions. The equations of motion which govern the amplitudes $q_n$ follow from the application of Lagrange's equation, and have the following well known form:

$$M\ddot{q} + C\dot{q} + Kq = F, \quad (2)$$

where M, C, and K are respectively the mass, damping, and stiffness matrices, and the vector F contains the generalized forces. The mnth entry of the mass matrix can in general be written in the following form:

$$M_{mn} = \sum_{r=1}^{N_s} \int_{V_r} \rho_r(x)\phi_m^T(x)\phi_n(x)\,dx, \quad (3)$$

where the summation covers each subsystem (for example beam, plate, shell, or acoustic volume) which forms part of the complete system, and $\rho_r(x)$ is the volume density of the rth subsystem. The mnth entry of the stiffness matrix can be formulated by writing the strain-displacement and stress-strain relations for the rth subsystem as follows:

$$\epsilon_r = \Delta_r u, \quad \sigma_r = D_r \epsilon_r. \quad (4,5)$$

Here $\sigma_r$ and $\epsilon_r$ are respectively the stress and strain vectors, and $D_r$ is the constitutive matrix. The term $\Delta_r$ which appears in equation (4) is a matrix of differential operators (in the spatial coordinates x) which acts on the system displacements u to produce the strain $\epsilon_r$. It can be noted that, with the correct identification of the relevant symbols, equations (4) and (5) are applicable to any type of subsystem, ranging for example from a bending beam to a three-dimensional elastic continuum: in the first case the stress and strain are scalars which correspond to the beam bending moment and curvature, whereas in the second case equations (4) and (5) correspond to the standard three-dimensional elasticity relations in which both the stress and strain have six components (three direct terms and three shear terms). With the notation introduced in equations (4) and (5), the mnth component of the stiffness matrix can now be written in the following form:

$$K_{mn} = \sum_{r=1}^{N_S} \int_{V_r} (\Delta_r \phi_m)^T \mathbf{D}_r \Delta_r \phi_n \, d\mathbf{x}. \tag{6}$$

The damping matrix C which appears in equation (2) cannot in general be expressed in a simple form analogous to either equation (3) or equation (6): the physical causes of damping are various and complex, and a purely theoretical estimate of C may be significantly in error. For this reason it is usual to adopt a semi-empirical approach to the evaluation of C, in which either Rayleigh damping is assumed, or a loss factor model of the damping is employed. In the first case, it is assumed that C is a linear combination of M and K, so that equation (2) can be diagonalized by a transformation to modal coordinates. In the second case, it is assumed that each subsystem is hysteretically damped, so that the contribution of the rth subsystem to C is directly proportional to the contribution of this subsystem to K: if the damping varies significantly from subsystem to subsystem, then this can lead to a damping matrix C which is not a linear combination of M and K. Further aspects of the damping model adopted are discussed in the following sections.

The final term which appears in equation (2) is the generalized force vector F; this vector has the following components:

$$F_m(t) = \sum_{r=1}^{N_S} \int_{V_r} \mathbf{p}_r(\mathbf{x}, t)^T \phi_m(\mathbf{x}) \, d\mathbf{x}, \tag{7}$$

where $p_r(x,t)$ represents the distributed loading which acts on subsystem r. The distributed loading may be random in both space and time, and this will lead to random (and generally correlated) generalized forces. In this case equation (2) is most easily solved in the frequency domain by using spectral analysis techniques. More generally, a frequency domain solution to equation (2) is also the preferred approach for harmonic forcing, and thus the frequency domain is considered exclusively in what follows. The Fourier transform of equation (2) yields the following:

$$[-\omega^2 M + i\omega C + K]q = Dq = F, \tag{8}$$

where $\omega$ is the circular frequency and D is termed the dynamic stiffness matrix of the system. It should be noted that the terms q and F which appear in equation (8) are complex frequency dependent quantities which represent the Fourier transforms of the generalized coordinates and generalized forces; for harmonic excitation, these quantities represent the complex amplitudes of the response and forcing.

Equations (3) and (6–8) constitute the equations of motion of a general built-up system. These equations allow for a wide range of potential modeling techniques via the choice of the admissible functions $\phi_n(x)$; in fact, the equations encompass all possible energy based formulations ranging from the Rayleigh Quotient to the h- and hp-versions of the finite element method. The choice of a suitable set of admissible functions depends to a large extent on the nature of the structure to be analyzed (including the nature of the excitation) and the computational resources which are available.

Particular problems arise when considering medium to high frequency vibrations of complex structures. Under these circumstances, the structural deformation can have a very short wavelength, meaning that an unfeasible number of admissible functions may be needed to capture the detailed behavior of the system. In what follows, a method is presented whereby the admissible functions are partitioned into "long" and "short" wavelength functions, and the response associated with the short-wavelength functions is computed by using statistical, rather than deterministic, techniques.

1.2 WAVENUMBER PARTITIONING AND GLOBAL MODES

In what follows the admissible functions which appear in equation (1) are partitioned into two sets which are nominally referred to as "global" and "local" admissible functions, so that the equation is modified to read as follows:

$$\mathbf{u}(\mathbf{x}, t) = \sum_{n=1}^{N_g} q_n^g(t)\phi_n^g(\mathbf{x}) + \sum_{n=1}^{N_l} q_n^l(t)\phi_n^l(\mathbf{x}), \tag{9}$$

where the suffices g and l are used respectively to denote the global and local sets. The partitioning is made on the following general basis: the global admissible functions are intended to capture the long wavelength deformations of the structure while the local admissible functions are intended to capture the short wavelength deformations. As explained in what follows, a statistical energy analysis (SEA) model of the response associated with the local admissible functions is employed in the present work to eliminate the need for a detailed deterministic model.

The global and local admissible functions are clarified by considering an example of a three-dimensional beam framework comprised of closed section beam members. At a specified frequency, a single beam within the framework can propagate three types of elastic wave: bending, torsional, and axial waves. The torsional and axial waves generally have a much longer wavelength than the bending waves, and structural deformations on this scale would be included in the set of "global" admissible functions, while the "local" trail functions would encompass the bending wavelength.

The use of the terminology "global" and "local" is related to the fact that the modal density of a single beam is relatively low for axial and torsional modes in comparison with bending modes. Over a given frequency band, the beam may have a theoretical mode count of say 0.1 for axial modes and say 4.0 for bending modes; this implies that the beam is unlikely to exhibit an axial mode within the frequency band, although axial motion may contribute to a mode of the whole structure—that is, a "global" mode (simplistically, a ten element framework would have an "axial" mode count of unity). In contrast, the beam is highly likely to exhibit a number of bending modes within the frequency band, and when the beam is in-situ these modes could contribute to either localized ("local") or extended modes of the complete framework.

From a practical point of view, the "global" admissible functions could consist of a relatively coarse mesh finite element model which is able to capture the longer wavelength deformations of the structure. The "local" admissible functions could then be employed to enhance this model and capture the short wavelength deformation. If the hierarchical (or hp-version) finite element method is employed, the local admissible functions could be identified in principle with the internal or hierarchical shape functions. The main feature of the following analysis is that the response encompassed by the "local" trail functions is modeled by using SEA, so that all aspects of the dynamics not covered by this approach should be incorporated within the global admissible functions.

Having partitioned equation (1) in the form of equation (9), it follows that the system equations of motion, equation (8), can be partitioned as follows:

$$\begin{pmatrix} D_{gg} & D_{gl} \\ D_{gl} & D_{ll} \end{pmatrix} \begin{pmatrix} q^g \\ q^l \end{pmatrix} = \begin{pmatrix} F^g \\ F^l \end{pmatrix}. \quad (10)$$

Without loss of generality, the global coordinates $q^g$ can be selected (or transformed) so that the matrix partition $D_{gg}$ is diagonal, providing a Rayleigh damping model is assumed for the response in these coordinates. In this case the global admissible functions $\phi_n^g(x)$ can be interpreted as "global modes", although it should be noted that the true modes of the system cannot be modeled solely in terms of $q^g$ but also require a contribution from $q^l$. If $D_{gg}$ is a diagonal matrix then the nth diagonal entry will have the following form:

$$(D_{gg})_{nn} = \omega_n^2(1 + i\eta_{nn}) - \omega^2, \quad (11)$$

where $\omega_n$ and $\eta_n$ are the natural frequency and loss factor associated with the nth "global mode", and it has been assumed that the mode shape $\phi_n^g(x)$ is scaled to unit generalized mass.

The matrix partition $D_{gl}$ which appears in equation (10) governs the coupling between the global and local degrees of freedom, and this has contributions from the three matrices M, C, and K which appear in equation (8). It will be assumed in what follows that each local admissible function is identified with a single subsystem, so that the admissible function is everywhere zero except within this subsystem. Under this assumption the dominant contribution to $D_{gl}$ can be identified by considering the integrals which appear in equations (3) and (6). In order to do this it is helpful to focus on the coupling between global mode m and local coordinate n (defined over subsystem r), and to define the following integrals $$M_{mn}^{ll} = \int_{V_r} \rho(x) \phi_m^{lT}(x) \phi_n^l(x) dx, \quad K_{mn}^{ll} = \int_{V_r} (\Delta_r \phi_n^l)^T D_r \Delta_r \phi_n^l dx, \quad (12, 13)$$

$$M_{mn}^{gl} = \int_{V_r} \rho(x) \phi_m^{gT}(x) \phi_n^l(x) dx, \quad K_{mn}^{gl} = \int_{V_r} (\Delta_r \phi_m^g)^T D_r \Delta_r \phi_n^l dx. \quad (14, 15)$$

By definition, the global admissible functions are of long wavelength relative to the local admissible functions, and hence it follows that $o(\Delta_r \phi_m^g)/o(\phi_m^g) \ll o(\Delta_r \phi_n^l)/o(\phi_n^l)$. If the local coordinate is resonant, so that $o(\omega^2 M_{nn}^{ll}) = o(K_{nn}^{ll})$, then it follows from equations (12–15) that $o(K_{mn}^{gl}) \ll o(\omega^2 M_{mn}^{gl})$. Given that the influence of the damping matrix C will generally be small, it can be concluded that, under the stated conditions, the dominant contribution to $D_{gl}$ will arise from inertial coupling, leading to the following:

$$D_{gl} = -\omega^2 M_{gl}, \quad (16)$$

where $M_{gl}$ is the appropriate partition of M. It can be noted that certain choices of global and local admissible functions can render equation (16) exact; if, for example, the local admissible functions are taken to be the blocked modes of a subsystem, i.e., the modes obtained under clamped boundary conditions, and the global admissible functions are expressed in terms of static or "constraint" modes, then, by definition, the two sets of functions are stiffness-orthogonal and all coupling occurs through the mass matrix.

Accordingly, the precise form of the partition $D_{ll}$ which appears in equation (10) is not required under the present formulation. The system response is sought by re-expressing equation (10) in the following form:

$$(D_{gg} - D_{gl} D_{ll}^{-1} D_{gl}^T) q^g = F^g - D_{gl} D_{ll}^{-1} F^l, \quad (17)$$

$$D_{ll} q^l = F^l - D_{gl}^T q^g. \quad (18)$$

Equation (17) follows by eliminating $q^l$ from the first row of equation (10), while equation (18) follows immediately from the second row of equation (10). The rationale behind equations (17) and (18), and the method of solution, is described in the following sections. In this regard, equation (17) is referred to as the global equation of motion, while equation (18) is described as the local equation of motion.

2. SOLUTION OF THE GLOBAL EQUATION OF MOTION 2.1 THE MODIFIED DYNAMIC STIFFNESS MATRIX: FUZZY STRUCTURES

The left side of equation (17) contains a modification to the global dynamic stiffness matrix $D_{gg}$ which arises from the presence of the local degrees of freedom. The mnth component of this additional matrix can be expressed in the following form:

$$(\mathbf{D}_{gl} \mathbf{D}_{ll}^{-1} \mathbf{D}_{gl}^T)_{mn} = \sum_{j=1}^{N_l} \sum_{k=1}^{N_l} (\mathbf{D}_{gl})_{mj} (\mathbf{D}_{ll}^{-1})_{jk} (\mathbf{D}_{gl})_{nk}, \quad (19)$$

where the summations are taken over the local coordinates. This expression can be considerably simplified by making a number of assumptions regarding the nature of the local admissible functions. First, as is common in SEA, it can be assumed that the local coordinates are weakly coupled so that $D_{ll}$ is nearly diagonal and can be approximated as being diagonal for the present purposes. If the local admissible functions are further taken to be mode shapes of the uncoupled (or "blocked") subsystems (scaled to unit generalized mass), then equation (19) simplifies to the following:

$$(\mathbf{D}_{gl} \mathbf{D}_{ll}^{-1} \mathbf{D}_{gl}^T)_{mn} = \sum_{j=1}^{N_l} (\mathbf{D}_{gl})_{mj} (\mathbf{D}_{gl})_{nj} [\omega_j^2 (1 + i\eta_j) - \omega^2]^{-1}, \quad (20)$$

where $\omega_j$ and $\eta_j$ represent the natural frequency and loss factor of local mode j. If the complete system contains $N_S$ subsystems, and subsystem r has $N_r$ modes, then equation (20) can be rewritten in the following form:

$$(\mathbf{D}_{gl} \mathbf{D}_{ll}^{-1} \mathbf{D}_{gl}^T)_{mn} = \sum_{r=1}^{N_S} \sum_{k=1}^{N_r} (\mathbf{D}_{gl})_{mj(k,r)} (\mathbf{D}_{gl})_{nj(k,r)} [(\omega_k^r)^2 (1 + i\eta_k^r) - \omega^2]^{-1}, \quad (21)$$

where $\omega_k^r$ and $\eta_k^r$ represent the natural frequency and loss factor of local mode k of subsystem r, and the symbol j(k,r) is used to indicate the position of this mode in the total sequence of local modes. It follows from equations (14) and (16) that the product which appears within the summation in equation (21) can be written as follows:

$$(D_{gl})_{mj(k,r)} (D_{gl})_{nj(k,r)} = \omega^4 j_{rmn}^2(k), \quad (22)$$

where $$j_{rmn}^2(k) = \int_{V_r}\int_{V_r} \rho(\mathbf{x})\rho(\mathbf{x}')\phi_m^{gT}(\mathbf{x})\mathbf{R}_r(\mathbf{x},\mathbf{x}',k)\phi_n^g(\mathbf{x}')d\mathbf{x}d\mathbf{x}', \quad (23)$$

$$\mathbf{R}_r(\mathbf{x},\mathbf{x}',k) = \phi_{j(k,r)}^l(\mathbf{x})\phi_{j(k,r)}^{lT}(\mathbf{x}'). \quad (24)$$

The function $R_r$ which appears in equation (24) can be viewed as a form of modal correlation coefficient for the local modes in subsystem r. If the final term on the right of equation (21) is a smooth function of $\omega_k^r$, then it is admissible to average $R_r$ over a group of local modes k. In this case a good approximation to $R_r$ can be obtained by employing a high frequency asymptotic estimate of $\phi_{j(k,r)}^l$ such as a simple standing wave system. The dimensionless term $j_{rmn}^2$ which appears in equation (23) can be interpreted as a form of a "joint acceptance function" between the global modes and the local modes in subsystem r.

The use of equation (22) in equation (21) leads to the following result for the additional dynamic stiffness matrix arising from the presence of the local modes:

$$(\mathbf{D}_{gl}\mathbf{D}_{ll}^{-1}\mathbf{D}_{gl}^T)_{mn} = \omega^4 \sum_{r=1}^{N_S}\sum_{k=1}^{N_r} j_{rmn}^2(k)[(\omega_k^r)^2(1+i\eta_k^r)-\omega^2]^{-1}. \quad (25)$$

This expression can be further simplified by considering the properties of the final summation which appears on the right hand side. In order to do this, it is helpful to separately consider the contribution arising from the resonant local modes ($\omega_k^r \approx \omega$) and from the inertia dominated local modes ($\omega_k^r \ll \omega$). This is done in the following subsections. The contribution arising from stiffness dominated local modes ($\omega_k^r \gg \omega$) is not considered because this will normally be negligible.

2.1.1 Contribution from the resonant modes

In considering the contribution to equation (25) arising from the local modes which are near to resonance ($\omega_k^r \approx \omega$), the term $j_{rmn}^2(k)$ can reasonably be assumed to be independent of k, at least over the restricted range of the resonant modes; equation (25) can then be simplified by considering the properties of the following sum:

$$S_r = \sum_{k=1}^{N_r} [(\omega_k^r)^2(1+i\eta_k^r)-\omega^2]^{-1}. \quad (26)$$

In a one-dimensional subsystem, the sum can be shown to have the following bounds (See R. S. Langley 1994 *Journal of Sound and Vibration* 178, 483–500. Spatially averaged frequency response envelopes for one and two-dimensional structural components):

$$(\pi v_r/2\omega)\tanh(\pi m_r/2) \leq -\text{Im}(S_r) \leq (\pi\sigma_r/2\omega)\coth(\pi m_r/2), \quad (27)$$

$$|\text{Re}(S_r)-(\pi v_r/2\omega)\gamma| \leq (\pi v_r/2\omega)\left[\frac{\sin(\pi m_r)}{\cosh(\pi m_r)-\cos(\pi m_r)}\right], \quad (28)$$

where $v_r$ is the modal density of subsystem r and $m_r=\omega\eta_r v_r$ is the subsystem modal overlap factor (in which $\eta_r$ is the average loss factor). The term $\gamma$ which appears in equation (28) is dependent on the nature of the dispersion relation of the subsystem: $\gamma=0$ for a non-dispersive system, while $\gamma=-1$ for bending waves in a beam. If the system modal overlap is high, then equations (27) and (28) lead to the following results:

$$\text{Im}(S_r) \approx -(\pi v_r/2\omega), \quad \text{Re}(S_r) \approx (\pi v_r/2\omega)\gamma. \quad (29,30)$$

Although equations (27) and (28) were derived for a one-dimensional subsystem, the equations also give an approximate indication of the range of variation in $S_r$ for a two-dimensional system such as a plate. The main difference being that the natural frequencies of a two-dimensional system have a pseudo-random spacing while those of a one-dimensional system have a simple deterministic spacing. R. H. Lyon has considered various aspects of the statistics of $S_r$ for the two-dimensional case: on the assumption that the occurrence of natural frequencies forms a Poisson random process, it can be shown that $E[\text{Im}(S_r)]=-(\pi v_r/2\omega)$, in agreement with equation (29), and also that $E[\text{Re}(S_r)]=0$ (See R. H. LYON 1967 *Journal of the Acoustical Society of America* 45, 545–565. Statistical analysis of power injection and response in structures and rooms.). Furthermore, the ratio of the standard deviation to the mean for the imaginary part of the sum is given by $$\sigma/\mu = 1/\sqrt{\pi m_r},$$

so that the coefficient of variation reduces with increasing modal overlap.

On the basis of the above, it is clear that the simplest approximation to $S_r$ (which will be strictly valid at high modal overlap) is to employ equation (29) for the imaginary part and to approximate the real part to zero. Equation (25) becomes the following:

$$(\mathbf{D}_{gl}\mathbf{D}_{ll}^{-1}\mathbf{D}_{gl}^T)_{mn} = -i(\pi\omega^3/2)\sum_{r=1}^{N_S} \bar{j}_{rmn}^2 v_r, \quad (31)$$

where $\bar{j}_{rmn}^2$ represents the average value of $j_{rmn}^2(k)$. This result implies that the local modes act to damp the global modes; by considering a diagonal component m=n of the above result, it is clear that the local modes produce an effective loss factor of the following form:

$$\eta_m^{eff} = (\pi\omega/2)\sum_{r=1}^{N_S} \bar{j}_{rmn}^2 v_r. \quad (32)$$

This extremely simple result is in full agreement with recent work on fuzzy structure theory: such work is concerned with the effect of "fuzzy" or uncertain attachments on the dynamics of a master structure—the fuzzy attachments are normally considered to be a set of oscillators having random properties. One of the key results of fuzzy structure theory is that, under the appropriate conditions, the fuzzy attachments add damping to the master structure to a degree which depends on the modal density of the attachments but not on the loss factor of the attachments. This result is mirrored in equation (32): in the present analysis the local modes take on the role of the fuzzy structure and the global modes act as the master structure.

2.1.2 Contribution from the inertia dominated modes

The contribution to equation (25) arising from inertia dominated local modes ($\omega_k^r \ll \omega$) can be written in the following form:

$$(\mathbf{D}_{gl}\mathbf{D}_{ll}^{-1}\mathbf{D}_{gl}^T)_{mn} = -\omega^2 \sum_{r=1}^{N_S} \sum_{k=1}^{N_r^I} j_{rmn}^2(k), \quad (33)$$

3.2 where $N_r^I$ represents the number of inertia dominated modes. The result yielded by equation (33) will be determined by the k-dependency of the coefficient $j_{rmn}^2(k)$; it is shown in section 5, for example, that a significant negative effective mass results from equation (33) if the subsystem is an elastic rod.

2.2 EVALUATION OF THE MODIFIED FORCING VECTOR

2.2.1 General considerations

The global equation of motion, equation (17), contains a forcing term on the right hand side which arises from the generalized forces acting on the local coordinates. The mth component of this force can be written as follows:

$$(\mathbf{D}_{gl}\mathbf{D}_{ll}^{-1}\mathbf{F}^l)_m = \sum_{j=1}^{N_l} \sum_{k=1}^{N_l} (\mathbf{D}_{gl})_{mj}(\mathbf{D}_{ll}^{-1})_{jk} F_k^l. \quad (34)$$

Following the same line of development as in the previous sub-section, this equation can be re-written in the following form:

$$(\mathbf{D}_{gl}\mathbf{D}_{ll}^{-1}\mathbf{F}^l)_m = \sum_{r=1}^{N_S} \sum_{k=1}^{N_r} (\mathbf{D}_{gl})_{mj(k,r)} F_{j(k,r)}^l [(\omega_k^r)^2(1 + i\eta_k^r) - \omega^2]^{-1}, \quad (35)$$

where only the diagonal entries of $D_{ll}$ have been retained. An approximate evaluation of the summation which appears in equation (35) is complicated by the fact that the sign of both $(D_{gl})_{mj(k,r)}$ and $F_{j(k,r)}^l$ can oscillate with the summation index k; this problem can be circumvented by considering the modulus squared of the generalized force, which has the following approximate form:

$$|(\mathbf{D}_{gl}\mathbf{D}_{ll}^{-1}\mathbf{F}^l)_m|^2 = \omega^4 \sum_{r=1}^{N_S} \sum_{k=1}^{N_r} j_{rmn}^2(k) |F_{j(k,r)}^l|^2 / [(\omega_k^r)^2(1 + i\eta_k^r) - \omega^2]|^2, \quad (36)$$

where equation (22) has been employed, and cross product terms between the various local modes k have been taken to average to zero—this result will hold if the local mode generalized forces $F_{j(k,r)}^l$ are uncorrelated, which is a standard assumption within statistical energy analysis. As in the case of equation (25), both the resonant and the inertia dominated local modes will contribute to the summation which appears in equation (36). By analogy with the analysis contained in sections 2.1.1 and 2.12, the summation can be evaluated approximately to yield the following result:

$$|(\mathbf{D}_{gl}\mathbf{D}_{ll}^{-1}\mathbf{F}^l)_m|^2 = \sum_{r=1}^{N_S} \langle |F_{j(k,r)}^l|^2 \rangle_k \left\{ \langle j_{rmn}^2/2\eta_k^r \rangle_k \omega \pi v_r + \sum_{k=1}^{N_r'} j_{rmn}^2(k) \right\}, \quad (37)$$

where $\langle\ \rangle_k$ denotes an average over the local modes. The generalized force $D_{gl}D_{ll}^{-1}F^l$ which appears in equation (17) can now be re-constructed from equation (37). It should be noted, this result does not contain any phase information. The resonant and inertia dominated contributions to equation (37) are in quadrature, but the phase of these terms relative to the global generalized forces $F^g$ is not as yet fully determined; this issue is considered further in section 2.2.2.

Equations (36) and (37) are based on the assumption that the cross product terms which arise when equation (35) is squared will average to zero. As stated previously, this result will hold if the local mode generalized forces are uncorrelated, and this will be highly dependent on the nature of the applied loading. For rain-on-the-roof forcing (often assumed in SEA), the generalized forces are in fact uncorrelated, while for other types of loading it is possible that cross-correlation terms can have a significant effect, in which case equations (36) and (37) will yield a poor estimate of the modified force vector. An alternative approach to the calculation of the modified force vector, which does not rely on the assumption of uncorrelated local mode generalized forces, is presented in section 2.2.3.

2.2.2 Rain-on-the-roof forcing

In the special case of rain-on-the-roof forcing (a situation which is commonly assumed in SEA), the correlation between the global generalized force and the additional generalized force which appears in equation (17) can readily be established. Rain-on-the-roof forcing is defined such that the temporal Fourier transform of the distributed load $p_r$ which appears in equation (7) has the following property:

$$E[p_r(x,\omega)p_r^{*T}(x',\omega)] = S\delta(x-x'), \quad (38)$$

where $E[\ ]$ represents the expected value, S is a correlation matrix, and $\delta$ is the Dirac delta function. Now, following equation (35), the mth component of the force which appears on the right of equation (17) has the following form:

$$F_m^g - (\mathbf{D}_{gl}\mathbf{D}_{ll}^{-1}\mathbf{F}^l)_m = \quad (39)$$

$$F_m^g - \sum_{r=1}^{N_S} \sum_{k=1}^{N_r} (\mathbf{D}_{gl})_{mj(k,r)} F_{j(k,r)}^l [(\omega_k^r)^2(1 + i\eta_k^r) - \omega^2]^{-1},$$

where $$F_m^g = \sum_{r=1}^{N_S} \int_{V_r} \mathbf{p}_r^T(\mathbf{x})\phi_m^g(\mathbf{x})\,d\mathbf{x}, \quad F_{j(k,r)}^l = \int_{V_r} \mathbf{p}_r^T(\mathbf{x})\phi_{j(k,r)}^l(\mathbf{x})\,d\mathbf{x}. \quad (40,41)$$

The correlation between the two terms which appear on the right of equation (39) is determined by the correlation between $F_m^g$ and $F_{j(k,r)}^l$; in this regard it follows from equations (38), (40) and (41) that $$E[F_m^g F_{j(k,r)}^{l*}] = \int_{V_r} \phi_m^{gT}(\mathbf{x}) \mathbf{S} \phi_{j(k,r)}^l(\mathbf{x})\,d\mathbf{x}. \quad (42)$$

In most practical applications it is not restrictive to assume that S is diagonal and proportional to $p_r$, in which case it follows from equations (14) and (16) that $$E[F_m^g F_{j(k,r)}^{l*}] = -(\alpha/\omega^2)(\mathbf{D}_{gl})_{mj(k,r)}, \quad (43)$$

where $\alpha$ is some constant. It follows that the correlation between the two force components which appear in equation (39) has a similar form to the right hand side of equation (21), and the analysis methods outlined in sections 2.1.1 and 2.1.2 can therefore be employed to evaluate this quantity.

2.2.3 Alternative method of evaluating the modified forcing vector

As discussed previously, the method outlined in section 2.2.1 for calculating the modified forcing vector is based on the assumption that the local mode generalized forces are uncorrelated. If this is not a valid assumption, then an alternative approach can be developed by writing equation (34) in the following form:

$$(\mathbf{D}_{gl}\mathbf{D}_{ll}^{-1}\mathbf{F}^l)_m = \sum_{j=1}^{N_l} (\mathbf{D}_{gl})_{mj} q_j^{lB}, \quad \mathbf{q}^{lB} = \mathbf{D}_{ll}^{-1}\mathbf{F}^l. \quad (44, 45)$$

Here, $q^{lB}$ can be interpreted as the "blocked" local mode response, i.e. the local mode response obtained from equation (10) when the global response $q^g$ is enforced to be zero. It follows from equations (14) and (16) that equation (44) can be expressed in the following form:

$$(\mathbf{D}_{gl}\mathbf{D}_{ll}^{-1}\mathbf{F}^l)_m = \sum_{r=1}^{N_S}\sum_{k=1}^{N_r} \left\{ -\omega^2 \int_{V_r} \rho(\mathbf{x})\phi_m^{gT}(\mathbf{x})\phi_{j(k,r)}^l(\mathbf{x})d\mathbf{x} \right\} q_{j(k,r)}^{lB}, \quad (46)$$

and by taking the summation over k inside the integral this result can be re-written as follows:

$$(\mathbf{D}_{gl}\mathbf{D}_{ll}^{-1}\mathbf{F}^l)_m = \sum_{r=1}^{N_S} -\omega^2 \int_{V_r} \rho(\mathbf{x})\phi_m^{gT}(\mathbf{x})\mathbf{u}_r^B(\mathbf{x})d\mathbf{x}, \quad (47, 48)$$

$$\mathbf{u}_r^B(\mathbf{x}) = \sum_{k=1}^{N_r} q_{j(k,r)}^{lB} \phi_{j(k,r)}^l(\mathbf{x}).$$

The term $\mathbf{u}_r^B(\mathbf{x})$ represents the "blocked" local response of subsystem r; if some estimate of this quantity is available, then equation (47) can be used to yield the modified forcing vector—a specific example of this approach is given in section 5.1.2.

2.3 CALCULATION OF THE GLOBAL RESPONSE

Explicit expressions for those terms in the global equation of motion, equation (17), which arise from the presence of the local modes are presented in equations (31), (33), (37), and (47). Given these terms, the equations of motion can be solved to yield the global response vector $q^g$; if the excitation is random, then equation (17) yields the transfer function of the global response, and standard spectral analysis techniques can be used to obtain the response spectra and mean squared values.

Although the global mode deterministic response estimation has been shown derived using the method of dynamic stiffness analysis, it will be readily understood by those skilled in the art that other methods may be used, such as, but not by way of limitation, finite element analysis or component mode synthesis.

It is well known that uncertainties in the properties of a system can have a significant effect on the dynamic response; such uncertainties are normally allowed for in statistical energy analysis (SEA) by considering the mean and variance of the response of an ensemble of random systems. In the present work, uncertainties can affect the global mode response both directly through uncertainties in the matrix $\mathbf{D}_{gg}$ and indirectly through uncertainties in the local mode terms described by equations (31), (33), (37), and (47). If necessary, the effect of uncertainties in $\mathbf{D}_{gg}$ can be incorporated into the present analysis by using the stochastic finite element method (See A. Der KIUREGHIAN and J. B. KE 1988 *Probabilistic Engineering Mechanics* 3, 83–91. The stochastic finite element method in structural reliability.) to formulate the global admissible functions.

3. SOLUTION OF THE LOCAL EQUATIONS OF MOTION 3.1 STATISTICAL ENERGY ANALYSIS FORMULATION

The "local" coordinate equation of motion is given by equation (18), where it can be recalled that the coordinates $q^l$ relate to the short wavelength local modes in each of the $N_S$ subsystems, so that the dimension of $q^l$ may be extremely large. In preference to a deterministic approach, a solution to equation (18) can be sought by employing statistical energy analysis (SEA), in which each subsystem is assigned a single degree of freedom corresponding to the vibrational energy of the local modes. The SEA equations are developed by considering power balance for each subsystem, and this leads to a set of $N_S$ equations in the following form:

$$\omega\eta_r E_r + \omega\sum_{s=1}^{N_S} \eta_{rs} v_r (E_r/v_r - E_s/v_s) = P_r, r = 1, 2, \ldots, N_S, \quad (49)$$

where $\eta_r$, $v_r$, $E_r$, and $P_r$ are respectively the loss factor, modal density, energy, and external power input to subsystem r, and $\eta_{rs}$ is termed the coupling loss factor between subsystem r and subsystem s. The subsystem energies are normally considered to be averages over a specified frequency band, and ensemble averaging over a set of random systems is normally presupposed in deriving the coupling loss factors; the conditions required to assure the validity of equation (49) are discussed in R. H. LYON and R. G. DeJONG 1995 *Theory and Application of Statistical Energy Analysis*. Boston: Butterworth-Heinemann, second edition.

In relating equation (49) to equation (18), it can be noted that the coupling loss factors are not normally derived directly from the dynamic stiffness matrix $\mathbf{D}_{ll}$, but rather are based on an independent analysis which often involves a consideration of elastic wave transmission between the various subsystems. Within the context of the present approach, care is needed to ensure that the coupling loss factors employed in equation (49) are fully consistent with the local admissible functions which are adopted.

For example, a modeling strategy in which the complete set of admissible functions for a subsystem are taken to consist of the blocked modes and the static (or "constraint") modes should be considered. The blocked modes are defined as the modes of vibration obtained under clamped boundary conditions, while the static modes are the shapes obtained by statically deflecting one point on the boundary and holding all other boundary points fixed. The blocked modes are by definition uncoupled from each other and inertially coupled to the static modes.

A one-dimensional subsystem has a finite number of static modes, each of which has a smooth (long wavelength) distribution through the structure, and such modes would generally be included in the set of "global" admissible functions. In this case the local degrees of freedom (the blocked modes) of any subsystem are coupled only to the global degrees of freedom so that $\mathbf{D}_{ll}$ is strictly a diagonal matrix; this means that the coupling loss factors which appear in equation (49) should be set to zero (the blocked modes are of course indirectly coupled via the global trail functions, but this coupling is already allowed for within the present methodology, and the use of non-zero coupling loss factors would doubly account for this effect—this aspect is illustrated by the numerical example considered in section 5).

In contrast, a two-dimensional subsystem has an infinite number of static modes (since there are an infinite number of boundary points), and these can be combined to produce a limited number of smooth (long wavelength) functions and an infinite number of shorter wavelength functions—only the smooth functions would be included in the set of global admissible functions. In this case the local degrees of freedom consist of the blocked modes and the short wavelength static modes, so that $D_{ll}$ contains coupling terms, both within and across subsystems. Furthermore, the short wavelength static modes are commensurate with the short wavelength elastic waves which are employed in a wave calculation of the coupling loss factors, and in this case it can be argued that the conventional coupling loss factors should be included in equation (49).

To summarize, it is important to ensure that the coupling loss factors which are employed in equation (49) are consistent with the form of the matrix $D_{ll}$, and this is determined by the choice of the global and local admissible functions.

The power input which appears in equation (49) arises from both of the forcing terms which appear on the right of equation (18). The power input by the first term can be estimated by using standard methods, which are normally based on the impedance of an infinite subsystem; the second term on the right of equation (18) is non-standard since this term will result in a power input to the subsystem from the global modes—this issue is considered in detail in the following sub-section.

3.2 POWER INPUT FROM THE GLOBAL MODES

The power input from the global modes to the local modes can be estimated by considering initially the power input to a single local mode in a particular subsystem. In doing this, it is consistent with standard SEA methods to neglect the coupling between the local modes: this is equivalent to calculating the power input to an uncoupled (or "blocked") subsystem, and it is normally argued that the power input is not significantly affected by coupling between the subsystems. If the coupling to other local modes is neglected, then it follows from equation (18) that the equation of motion for local mode k of subsystem r has the following form:

$$[(\omega_k^r)^2(1+i\eta_k^r)-\omega^2]q_{j(k,r)}=F_{j(k,r)}^l-(D_{gl}^T q^g)_{j(k,r)}, \quad (50)$$

where the index j(k,r) is as defined in sections 2.1 and 2.2. Considering initially the case $F_{j(k,r)}^l=0$, the time averaged power input to the mode to can be written as $$P_{r,k}^g = \quad (51)$$

$$(1/2)\mathrm{Re}\{i\omega q_{j(k,r)}^l (\mathbf{D}_{gl}^T \mathbf{q}^g)^*_{j(k,r)}\} = (1/2)\mathrm{Re}\left\{\frac{i\omega |(\mathbf{D}_{gl}^T \mathbf{q}^g)_{j(k,r)}|^2}{(\omega_k^r)^2(1+i\eta_k^r)-\omega^2}\right\}.$$

The power input to the complete set of modes in subsystem r is therefore given by $$P_r^g = \sum_{k=1}^{N_r} (1/2)\mathrm{Re}\left\{\frac{i\omega |(\mathbf{D}_{gl}^T \mathbf{q}^g)_{j(k,r)}|^2}{(\omega_k^r)^2(1+i\eta_k^r)-\omega^2}\right\}. \quad (52)$$

This result can be simplified by employing the same techniques as were used to simplify equations (21) and (23): the denominator can be averaged over k and the sum over k can then be performed by employing equation (29). This procedure yields the following:

$$P_r^g = (\omega^4 \pi v_r/4)\sum_{m=1}^{N_g}\sum_{n=1}^{N_g} j_{rmn}^2 q_m q_n^*, \quad (53)$$

where $j_{rmn}^2$ is given by equation (25) and the summations cover the complete set of global modes. In considering the units of the various terms which appear in equation (53), it can be noted that $j_{rmn}^2$ is dimensionless while the generalized coordinates $q_{nr}$ have units of length$\times\sqrt{\text{(mass)}}$ (since the mode shapes are scaled to unit generalized mass), so that $P_r^g$ correctly has units of power. As would be anticipated, it can be seen that the power input to the local modes, given by equation (53), is equal to the power dissipated from the global modes via the fuzzy damping terms, equation (31).

Thus far, the case $F_{j(k,r)}^l=0$ has been considered; if $F_{j(k,r)}^l \neq 0$, then power is input to the subsystem via the local forcing, and also there is the possibility of interaction between the local and global forcing terms which appear on the right of equation (50). The power input by the local forcing, $P_r^l$, can be computed by using standard SEA procedures while any modification to the power input arising from interaction between the two forcing terms will depend upon their relative phase. If the two terms are considered to be uncorrelated, then the total power input is given by $P_r=P_r^g+P_r^l$; more generally, whatever the correlation between the two terms, the total power input will always fall within the bounds $P_r^g+P_r^l-\sqrt{(P_r^g P_r^l)} \leq P_r \leq P_r^g+P_r^l+\sqrt{(P_r^g P_r^l)}$. These bounds are narrow if either $P_r^g<<P_r^l$ or $P_r^l<<P_r^g$—the former case will apply to a weakly coupled subsystem (in the SEA sense) which has direct excitation, while the latter case will apply to any subsystem which is not directly excited. Given that weak coupling is often cited as a necessary condition for the successful application of SEA, it can be concluded that the present approach will yield a close estimate of the total power input under the normal SEA restrictions.

3.3 CALCULATION OF THE LOCAL RESPONSE

The response in the local modes can be calculated by solving the SEA equations, equation (49), to yield the subsystem energy levels. The power input which appears in equation (49) includes the power arising from the global modes, which can be estimated from equation (53) once the global mode responses $q_m$ have been calculated by using the method described in section 2. Equation (49) represents the standard form of the SEA equations: within the framework of the present analysis methodology this equation could readily be replaced with recent other methods, such as, but not by way of limitation, wave intensity analysis (See R. S. LANGLEY 1992 *Journal of Sound and Vibration* 159, 483–502. A wave intensity technique for the analysis of high frequency vibrations.), or vibrational conductivity analysis or techniques (See D. J. NEFSKE and S. H. SUNG 1989 *Journal of Vibration, Stress and Reliability in Design* 111, 94–100. Power flow finite element analysis of dynamic systems: basic theory and application to beams.). Furthermore, whereas equation (49) yields an estimate of the mean subsystem energies, approximate methods are also available whereby the variance of the subsystem energies can be estimated (See R. H. LYON and R. G. DEJONG 1995 *Theory anti Application of Statistical Energy Analysis*. Boston: Butterworth-Heinemann, second edition.)—again, such methods can readily be incorporated into the present analysis scheme.

4. SUMMARY OF THE ANALYSIS PROCEDURE

The present analysis approach is based on partitioning the response of the system into "global" and "local" components: the main distinguishing feature between these two components lies in the wavelength of the associated system response. The global component is intended to capture long wavelength deformations, whereas the local component relates to short wavelength deformations. Within this general framework it is possible to contemplate a wide range of detailed modeling strategies regarding the precise way in which the partitioning is implemented. The global mode deterministic response estimation was solved using a dynamic stiffness analysis approach. However, other methods such as finite element analysis, component mode analysis, etc. may be used. The local mode statistical response estimation was solved using a statistical energy analysis approach. Similarly, other methods such as wave intensity analysis, vibration conductivity analysis, etc., may be used. Both solution methods provide due allowance for the coupling which exists between the two types of responses.

The global equations of motion are given by equation (17), which includes a contribution to the dynamic stiffness matrix and the forcing vector arising from the presence of the local response. The contribution to the dynamic stiffness matrix is detailed in section 2.1, and a simple approximate closed form expression for this term is given by equations (31) and (33). These results are based on a number of assumptions, the most notable being that the local modes have a high degree of modal overlap; in this case the main effect of the local mode dynamics is to add damping and an effective mass to the global modes, in-line with fuzzy structure theory. If the adopted assumptions are invalid, then equation (19–21) provide a more accurate model of the effect of the local modes. The additional forcing term which appears in equation (17) is detailed in section 2.2, and in this case a simple closed form approximate expression for the forcing is given by equation (37) or (47). It can be stressed that with the present approach the global mode response can be found before the local response is known, so that the analysis method is direct rather than iterative.

The local mode response is computed by using SEA, equation (49). This equation includes an input power term which arises from the presence of the global modes, and an expression for this power is given by equation (53). This expression involves the global mode response, which must be computed from equation (17) prior to considering the local mode response. It can be noted that the term "local" response does not necessarily imply that the short-wavelength responses of the various subsystems are considered to be uncoupled—the SEA equations include the effect of coupling between the various subsystems, and fully allow for the fact that power can be transmitted throughout the whole structure by the action of the local modes alone.

5. EXAMPLE APPLICATION

5.1 A HYBRID ROD ELEMENT

Figure 5:
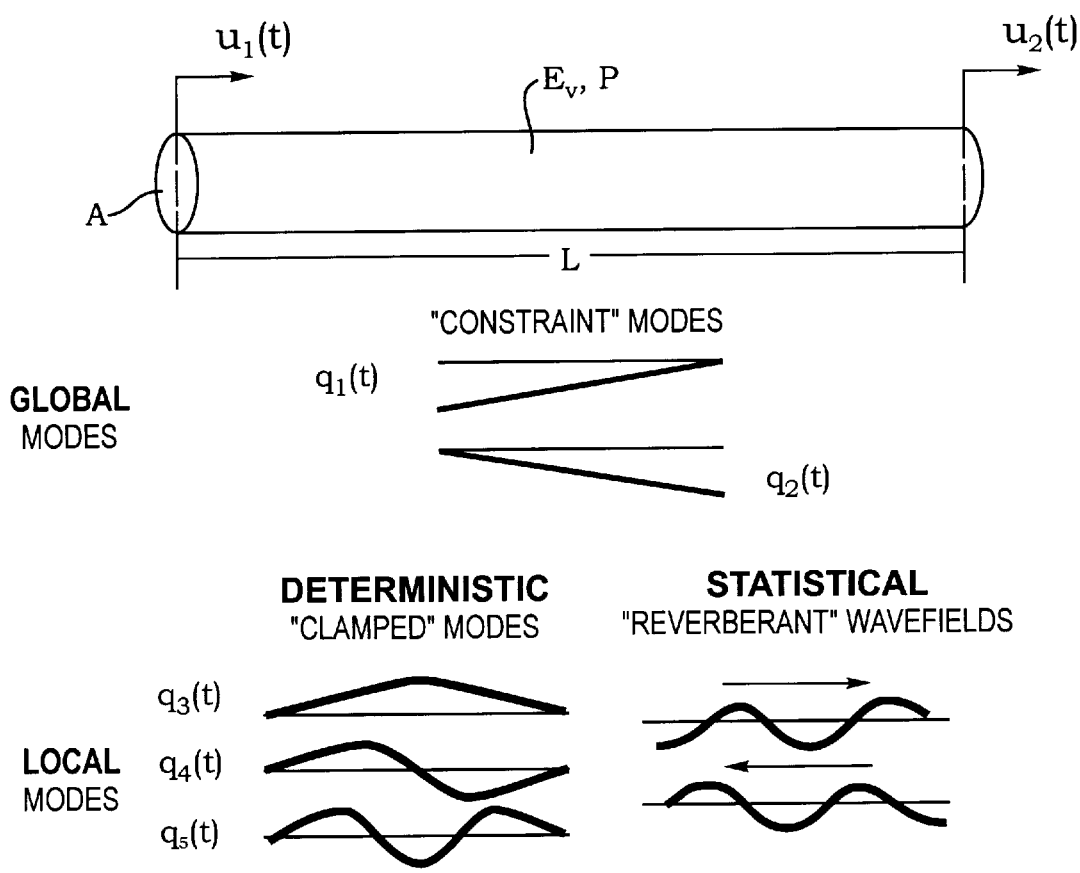
FIG. 5 is a schematic drawing of rod element and shows the nodal displacement and internal hierarchical shape functions for deterministic analysis and the alternative wavefield mode for statistical analysis.

The foregoing analysis is illustrated in what follows by application to a number of structures consisting of elastic rods—this choice of system allows an insight into the role of the various terms which appear in the hybrid analysis method, without introducing undue mathematical complexity. Each rod is modeled by using a single hierarchical finite element; with this approach the axial displacement of a generic rod element (having Young's modulus $E_Y$, density $\rho$, length $L$, and cross-sectional area $A$), which is shown in FIG. 5, is written in the following form:

$$u(x,t) = \qquad (54)$$

$$q_1(t)(1-x/L) + q_2(t)(x/L) + \sqrt{2/\rho A L} \sum_{n=1}^{\infty} q_{n+2}(t)\sin(n\pi x/L).$$

Here, $q_1$ and $q_2$ represent the nodal displacements of the element, i.e. the displacements at the two end points, and $q_{n+2}$ represents the amplitude of the nth "internal" or hierarchical shape function. The internal shape functions are taken to be the modes of a clamped rod $$\sqrt{2/\rho A L}\,\sin(n\pi x/L),$$

where the scaling factor $$\sqrt{2/\rho A L}$$

is introduced to enforce unit generalized mass. It can readily be shown that the non-zero entries of the upper triangle of the element mass matrix are as follows:

$$M_{11} = M_{22} = \rho A L/3,\ M_{12} = \rho A L/6,\ M_{1,n+2} = \sqrt{2\rho A L}\big/n\pi, \qquad (55\text{-}57)$$

$$M_{2,n+2} = -(-1)^n\sqrt{2\rho A L}\big/n\pi,\ M_{n+2,n+2} = 1. \qquad (58, 59)$$

Similarly, the non-zero entries of the upper triangle of the element stiffness matrix have the form $$K_{11}=K_{22}=E_Y A/L,\ K_{12}=E_Y A/L,\ K_{n+2,n+2}=\omega_n^2, \qquad (60\text{--}62)$$

where $$\omega_n = (n\pi/L)\sqrt{E_Y/\rho}$$

is the nth natural frequency of the clamped rod.

The wavenumber partitioning scheme, which is outlined in section 1.2, requires the generalized coordinates of the rod element to be sub-divided into a global set $q^g$ and a local set $q^l$. If the nodal displacements and the first s clamped modes are included in $q^g$ then this set will contain s+2 coordinates, while the local set will contain the remaining clamped modes. As described in section 2, the equations of motion which govern the global coordinates must be modified to allow for the presence of the local set, and this is done through the inclusion of an additional dynamic stiffness matrix (section 2.1) and an additional force vector (section 2.2). Furthermore, the global response injects power into the local response (section 3.2). These items are considered in the following sub-sections.

5.1.1 The modified "global" dynamic stiffness matrix

It can be shown from equations (19), (20), and (55–59) that the additional dynamic stiffness matrix ($\Delta D$ say) for the present element is zero apart from the 2×2 sub-block which relates to the nodal displacements. These non-zero components have the following form:

$$(\Delta D)_{11} = (\Delta D)_{22} = -2\omega^4 \rho A L \sum_{n=s+1}^{\infty} (1/n\pi)^2[\omega_n^2(1+i\eta_n) - \omega^2]^{-1}, \qquad (63)$$

-continued $$(\Delta \mathbf{D})_{12} = 2\omega^4 \rho A L \sum_{n=s+1}^{\infty} (-1)^n (1/n\pi)^2 [\omega_n^2(1+i\eta_n) - \omega^2]^{-1}. \quad (64)$$

As discussed in section 2.1, the summations which appear in equations (63) and (64) yield both a resonant and a non-resonant contribution. Taken together, these two contributions give the following:

$$(\Delta \mathbf{D})_{11} = (\Delta \mathbf{D})_{22} = iE_Y A k + 2\omega^2 \rho A L \sum_{n=s+1}^{\infty} (1/n\pi)^2, \quad (65)$$

$$(\Delta \mathbf{D})_{12} = -2\omega^2 \rho A L \sum_{n=s+1}^{\infty} (-1)^n (1/n\pi)^2, \quad (66)$$

where $$k = \omega \sqrt{\rho/E_Y}$$

is the wavenumber associated with the vibration frequency $\omega$: this term arises by putting $n\pi \approx kL$ for the resonant contribution to equation (63)—in addition, it has been noted that the modal density of the rod is given by $v=Lk/\pi\omega$. The resonant contribution which appears in equation (65) should only be included if the excitation frequency is encompassed by the resonant frequencies of the local modes, i.e., for $\omega < \omega_{s+1}$ the local modes are not resonant and the term $iE_yAk$ should be excluded.

If s=0, so that all of the clamped modes are included in the local coordinate set $q^l$, then the summations which appear in equations (65) and (66) can be evaluated to yield respectively $\frac{1}{6}$ and $-\frac{1}{12}$. In this case the total effective dynamic stiffness matrix for the global coordinates has the form $(D+\Delta D)_{11}=(D+\Delta D)_{22}=iE_yAk$ and $(D+\Delta D)_{12}=0$, where the static terms arising from the stiffness matrix K have been neglected on the grounds that $k>>(1/L)$ for high frequencies, so that $E_YAk>>E_YA/L$. The term $iE_YAk$ can be recognized as the dynamic stiffness of a semi-infinite rod; it is well known that the dynamic behavior of a damped one-dimensional system approaches that of an infinite or semi-infinite system at high frequencies, and it is reassuring to note that the present approach can reproduce this result under the appropriate conditions—namely, high modlal overlap, so that the summations which appear in equations (63) and (64) can justifiably be evaluated by using the methods outlined in section 2.

5.1.2 The modified "global" forcing vector

In the examples which follow, the applied forcing is taken to be a harmonic point load of complex amplitude P applied at a position $x_0$ on the rod element. The generalized force produced on the nth internal generalized coordinate (i.e. the generalized coordinate associated with the nth clamped mode) can in this case be written as follows:

$$F_n = P\sqrt{2/\rho A L} \sin(n\pi x_0/L). \quad (67)$$

As discussed in section 2.2, the generalized forces which act on the local coordinate set $q^l$ produce an addition to the force vector which acts on the global coordinate set $q^g$. Two methods of computing this additional force are outlined in sections 2.2.1 and 2.2.3; for the present loading case the generalized forces acting on the local modes are highly correlated, and thus the method described in section 2.2.3 must be adopted. The "blocked" local response $u^B(x)$ of the element can readily be calculated by considering the response of a point loaded clamped-clamped rod, and equation (47) then yields the following:

$$(D_{g l} D_{ll}^{-1} F^l)_1 = P[\sin k_c(L-\chi_0)/\sin k_cL] - P[1-(\chi_0/L)], \quad (68)$$

$$(D_{g l} D_{ll}^{-1} F^l)_2 = P(\sin k_c \chi_0/\sin k_c L) - P(\chi_0/L), \quad (69)$$

where $k_c = k - i\eta k/2$ is the complex wavenumber of the system. If the modal overlap is high, then equations (68) and (69) simplify to $$(D_{gl} D_{ll}^{-1} F^l)_1 = P\exp(-ik_c \chi_0) - P[1-(\chi_0/L)]. \quad (70)$$

$$(D_{gl} D_{ll}^{-1} F^l)_2 = P\exp(-ik_c(L-\chi_0)) - P(\chi_0/L). \quad (71)$$

It can be noted that the final term on the right of equations (70) and (71) will exactly cancel the "direct" generalized force acting on the nodal coordinates. Furthermore, the first term on the right of equations (70) and (71) could have been predicted directly by employing a ray tracing argument in the sense that the term represents the nodal force produced by the elastic wave which is generated at the point load. Finally, it should be noted that $u^B(x)$ represents the total blocked response of the element in the sense that all of the hierarchical generalized coordinates contribute to this result; some of these coordinates might, however, be included in the global set of coordinates rather then the local set and in this case, the contribution of these terms should be subtracted from equations (70) and (71).

5.1.3 Power input from the global response

The power input from the global response to the local response is given by equation (53). For the present rod element, this expression takes the following form:

$$P^g = E_y A k \omega (|q_1|^2 + |q_2|^2)/2. \quad (72)$$

This result can be identified as the power dissipated through the effective damping terms which appear in equation (65); equation (72) is also equivalent to the power transmitted to a semi-infinite rod by an imposed end motion q, and this is consistent with comments made in section 5.1.1 regarding the physical interpretation of the dynamic stiffness terms.

5.2 THE RESPONSE OF TWO COUPLED RODS

Figures 6, 7:
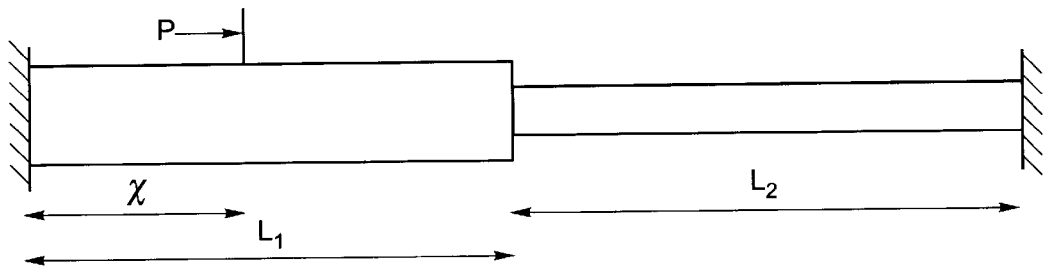
FIG. 6 is a schematic drawing of two coupled rods.
FIG. 7 is a table summarizing the three example systems considered in sections 5.2.1, 5.2.2, and 5.2.3.

A schematic of a structure which consists of two end-coupled rods (rod 1 and rod 2) is shown in FIG. 6. The Young's modulus, mass density, cross-sectional area, and length of rod i are denoted by $E_{Yi}$, $p_i$, $A_i$, and $L_i$ respectively, and the following non-dimensional parameters are introduced to describe the system:

$$\Omega = \omega v_1 = (\omega L_1/\pi)\sqrt{\rho_1/E_{Y1}}, \quad (73, 74)$$
$$v_R = v_2/v_1 = (L_2/L_1)\sqrt{E_{Y1}\rho_2/E_{Y2}\rho_1},$$

$$D_R = E_{Y2}A_2k_2/E_{Y1}A_1k_1 = \sqrt{E_{Y2}\rho_2/E_{Y1}\rho_1}, \quad (75, 76)$$
$$L_R = L_2/L_1.$$

The non-dimensional frequency $\Omega$ gives the approximate mode count for rod 1, i.e. the number of modes which resonate below $\omega$, while the term $D_R$ is the dynamic stiffness ratio of two semi-infinite rods which have the same physical properties as the finite rods. It can readily be shown that the elastic wave transmission coefficient from rod 1 to rod 2, $T_{12}$, and the associated power transmission coefficient $\tau_{12}$ are given by $$T_{12} = 2/(1+D_R), \tau_{12} = 4D_R/(1+D_R)^2, \quad (77,78)$$

so that $D_R$ gives a direct indication of the strength of coupling between the rods—a value of $D_R$ close to unity represents strong coupling. The modal overlap factors for the two rods can be written in terms of the non-dimensional parameters in the form $m_1=\omega\eta_1 v_1=\eta_1\Omega$ and $m_2=\eta_2\Omega v_R$, where $\eta_1$ and $\eta_2$ are the system loss factors.

Rod 1 is considered to be subjected to a point load of complex amplitude P acting at location $x_0$, and the response of the system is expressed in terms of the following non-dimensional vibrational energies:

$$E_1^3 = E_1/E_{1R}, E_2^3 = E_2/E_{1R}, E_{1R} = |P|^2 L_1/(E_1 A_1). \qquad (79\text{-}81)$$

Here $E_1$ and $E_2$ are the vibrational energies (deemed as twice the kinetic energy) of the two rods, and $E_{1R}$ is a reference energy. The response of the system is calculated by three methods: (i) the hybrid method described in sections 2–5, (ii) conventional statistical energy analysis, and (iii) the dynamic stiffness method (See R. S. LANGLEY 1990 *Journal of Sound and Vibration* 136, 439–452. Analysis of power flow in beams and frameworks using the direct-dynamic stiffness method.). The latter method is an exact approach which provides a benchmark against which the performance of the other two methods can be assessed. The three example systems summarized in the table of FIG. 7 are considered in the following sub-sections; in all cases the loss factors are taken to be $\eta_1=\eta_2=0.03$, rod 1 is driven at the point $x_0/L_1=037$, and the outer ends of the rods are taken to be clamped.

5.2.1 Example 1:

$v_R=12.3$

Figure 8:
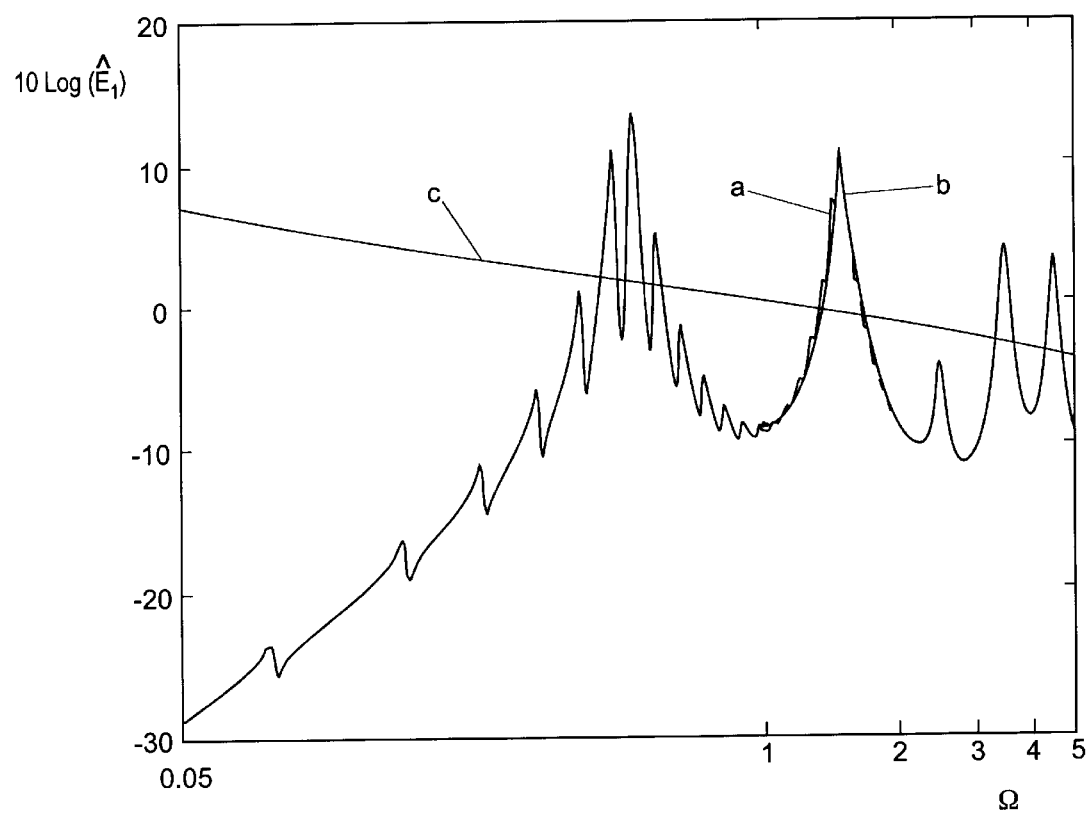
FIG. 8 is a graph of the non-dimensional energy in rod 1 of FIG. 6 for the first example system and shows the response for the coupled system (a) and the uncoupled system (b)

In this case rod 2 has a relatively high modal density and acts as a "fuzzy attachment" to rod 1. This phenomenon is illustrated in FIG. 8, where exact dynamic stiffness results for the energy in rod 1 are shown for both the coupled (rod 2 present) and uncoupled (rod 2 absent) case. It is clear that rod 2 acts mainly to provide additional damping to the modes of rod 1—the rapid undulations in the coupled result at low frequencies are caused by the individual modes of rod 2: as the frequency increases, the modal overlap of rod 2 exceeds unity and the effect of individual modes is no longer visible.

The hybrid modeling technique has been applied to the present system by taking the global degrees of freedom to include the first 10 hierarchical terms for rod 1 and the first 12 hierarchical terms for rod 2. This approach captures the clamped modes of rod 1 which lie below $\Omega=10$ and the clamped modes of rod 2 which lie below $\Omega=1$. For frequencies $\Omega>1$, the "global" degrees of freedom of rod 2 must be augmented with a "local" set, and this introduces a modification to the global equations of motion, as detailed in section 5.1.1. Once the global equations of motion have been solved, the power input to the local response is calculated according to section 5.1.3, and the corresponding vibrational energy is then found by employing a single subsystem SEA model.

Figure 9:
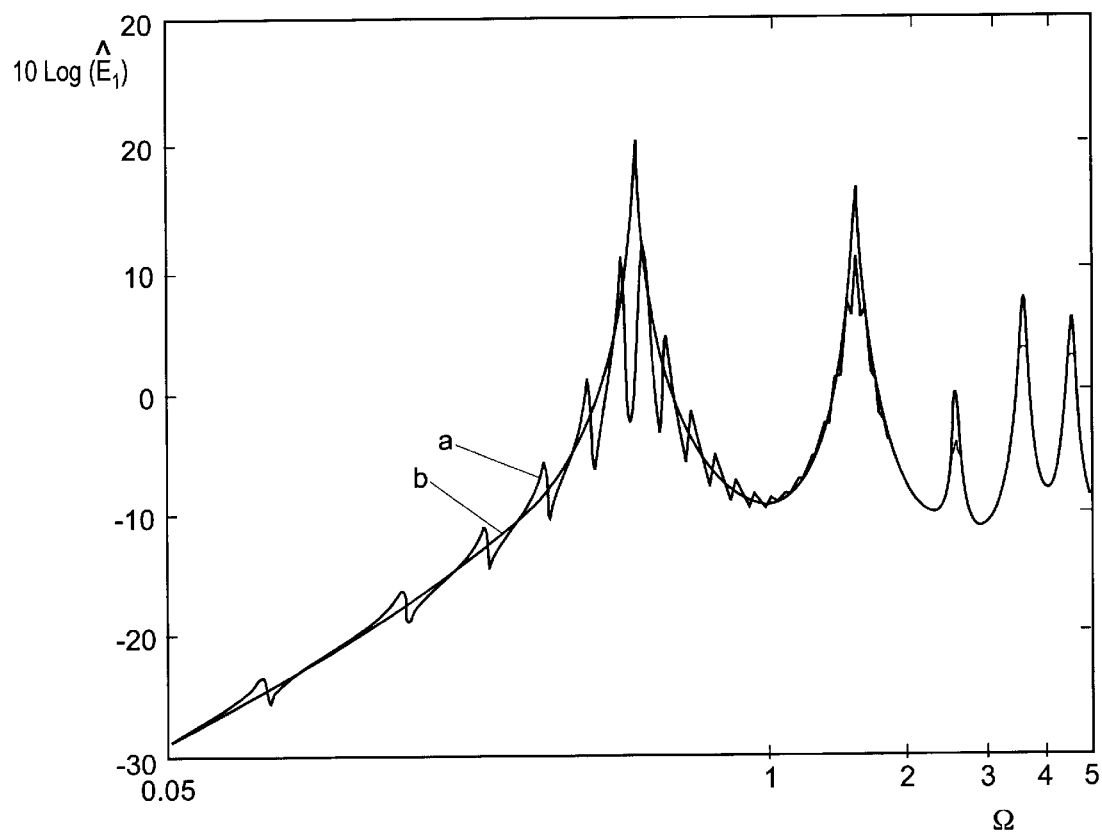
FIG. 9 is a graph of the non-dimensional energy in rod 1 of FIG. 6 for the first example system and shows the responses of the dynamic stiffness method (a), the present hybrid method (b), and the conventional SEA (c)
Figure 10:
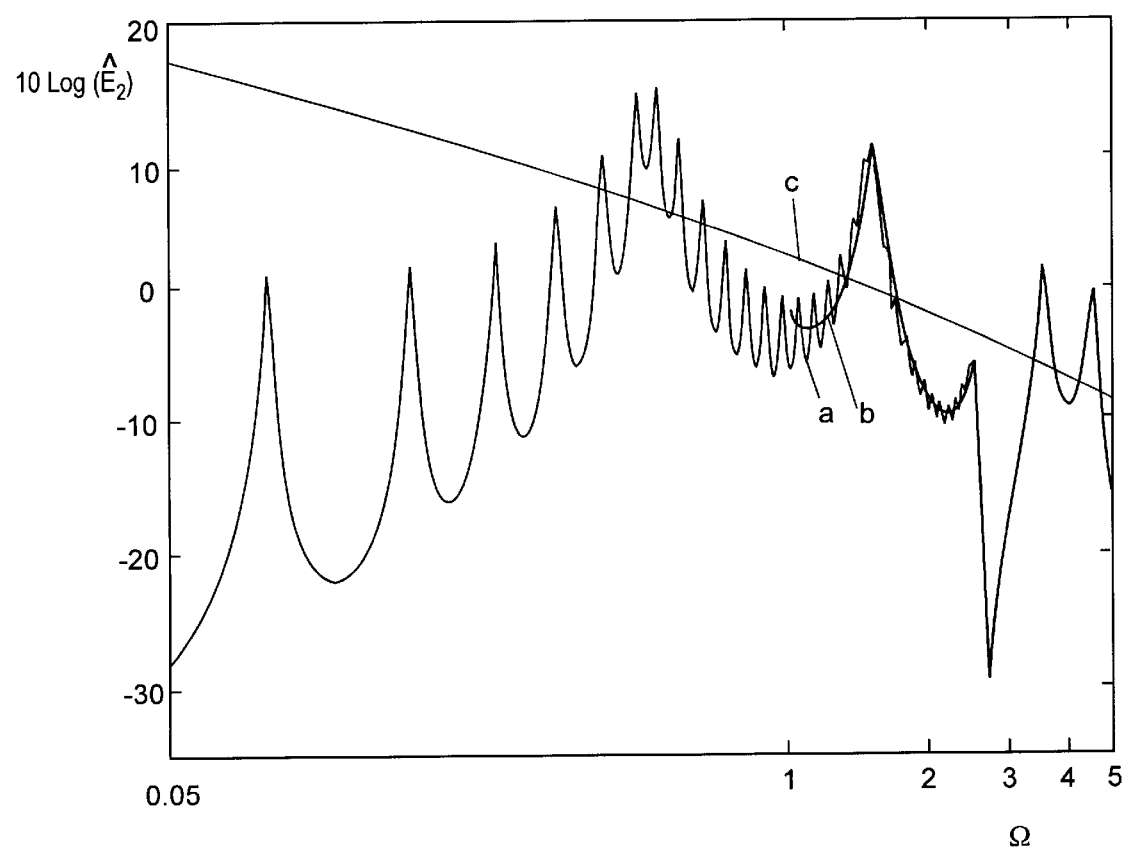
FIG. 10 is a graph of the non-dimensional energy in rod 2 of FIG. 6 for the first example system and shows the responses of the dynamic stiffness method (a), the present hybrid method (b), and the conventional SEA (c)

The results obtained by using this approach are compared in FIGS. 9 and 10 with exact dynamic stiffness results and also with the results of a conventional SEA calculation. The results for rod 1 are shown in FIG. 9: as would be expected, the current method yields results which are nearly identical to the exact results for frequencies up to $\Omega=1$. Beyond this frequency the present approach does not capture the effect of the individual modes of rod 2, but rather yields a smooth result which is a very good approximation to the exact response. The SEA result does not capture the individual resonant peaks associated with rod 1, and hence the method yields only an approximation to the mean level of the response. Very similar trends are shown in FIG. 10 for the case of rod 2.

The use of 10 and 12 hierarchical shape functions for rods 1 and 2, respectively, were chosen to yield an accurate response prediction for frequencies below $\Omega=1$. The response above this frequency is affected little by reducing the number of terms included in the global set of degrees of freedom—for example, it has been found that near exact results can be obtained over the range $1<\Omega<5$ by employing 6 hierarchical terms for rod 1 and no hierarchical terms for rod 2. Allowing for the fact that the outer end of each rod is clamped, this leads to 7 global degrees of freedom; in contrast, a conventional hierarchical model of the system over this frequency range would require around 70 degrees of freedom to capture all of the relevant modes of each rod.

5.2.2 Example 2:

$v_R=0.117$

In this example the excitation is applied to a rod of high modal density which is coupled to a rod of much lower modal density. The number of hierarchical terms employed in the hybrid method is 20 for rod 1 and 10 for rod 2, which covers the clamped modes below $\Omega=20$ for rod 1 and below $\Omega=85$ for rod 2. The frequency range considered is $0<\Omega<80$, so that the response of rod 1 must be augmented with a "local" response for $20<\Omega<80$; the local response modifies the global dynamic stiffness matrix as described in section 5.1.1, and contributes to the global force vector in accordance with section 5.1.2. The local response is driven by the global response (section 5.1.3), and a single subsystem SEA model is employed to compute the resulting vibrational energy.

Figure 11:
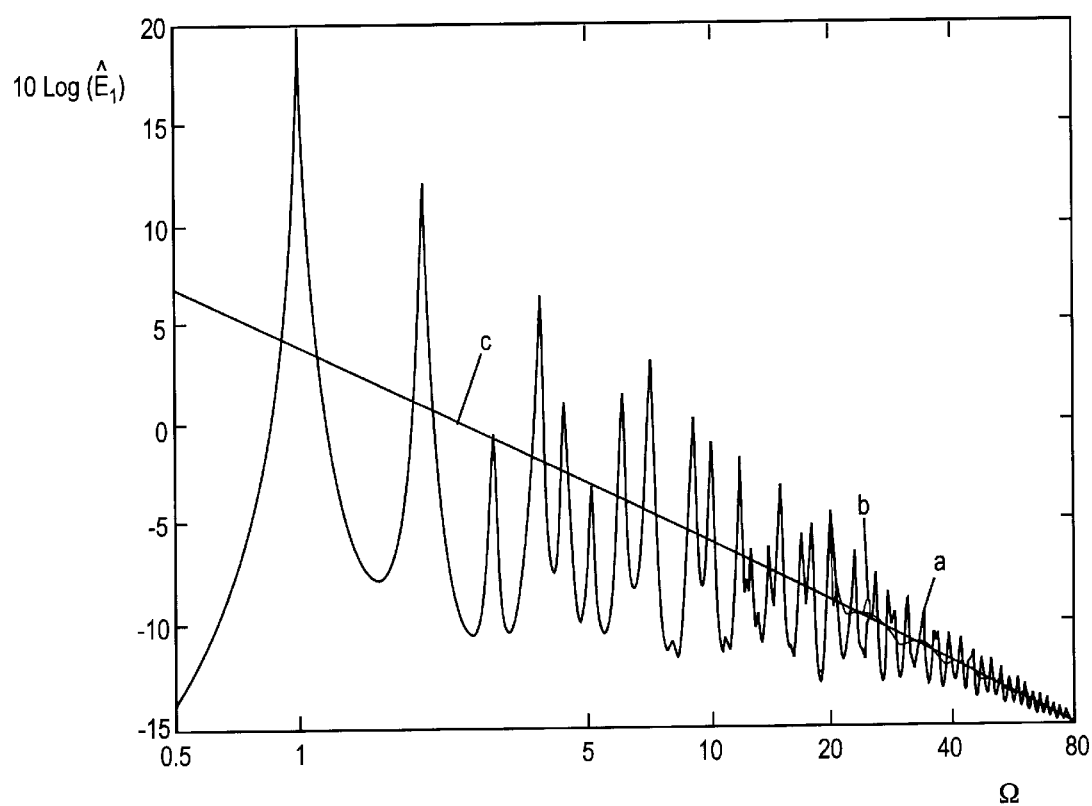
FIG. 11 is a graph of the non-dimensional energy in rod 1 of FIG. 6 for the second example system and shows the responses of the dynamic stiffness method (a), the present hybrid method (b), and the conventional SEA (c)
Figure 12:
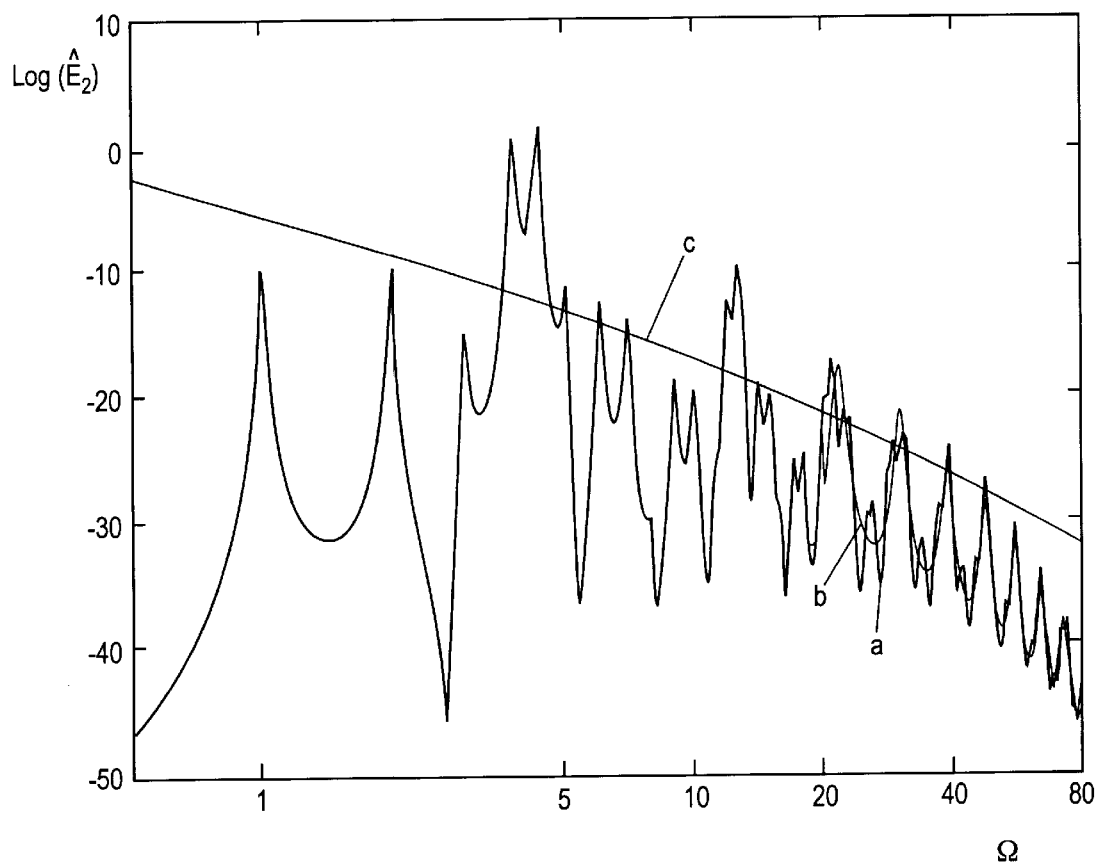
FIG. 12 is a graph of the non-dimensional energy in rod 2 of FIG. 6 for the second example system and shows the responses of the dynamic stiffness method (a), the present hybrid method (b), and the conventional SEA (c)

The vibrational energy in rod 1 is shown in FIG. 11: the present method yields a near exact prediction of the energy for $\Omega<20$ and an accurate smoothed approximation for $20<\Omega<80$. The standard SEA prediction is also in good agreement with the exact results for this rod—this is to be expected, since rod 1 is weakly coupled to rod 2, and behaves very much like a driven uncoupled subsystem which has high modal overlap, thus meeting the conditions for the successful application of SEA. The vibrational energy of rod 2 is shown in FIG. 12, where it can be seen that the present method again yields a good prediction over the whole frequency range. For $\Omega>20$ the method captures the individual modes of rod 2 but smoothes the effect of the modes of rod 1 (which are accounted for via the "local" response of rod 1). The standard SEA result shown in FIG. 12 is clearly biased; this is due to the fact that the coupled system does not meet the requirements of the method—rod 2 has a low modal overlap, and the forcing consists of a single point load rather than rain-on-the-roof excitation (which has a strong effect on the response of the driven subsystem at the coupling point).

The results shown in FIGS. 11 and 12 for $\Omega>20$ are not affected by a reduction in the number of hierarchical terms included in the set of global degrees of freedom for rod 1. If no hierarchical terms are included for rod 1, then the global degrees of freedom consist of the displacement of node 2 and the 10 hierarchical terms for rod 2, giving an 11 degree-of-freedom system. In contrast, a conventional hierarchical finite element model of the system would require around 95 degrees of freedom to fully capture the modes of vibration which lie below $\Omega=80$.

5.2.3 Example 3:

$v_R=1.723$

This example concerns two rods which have similar modal densities: 7 and 12 hierarchical terms are employed respectively for rods 1 and 2, and this captures the modes of vibration which lie below $\Omega=8$. For $\Omega>8$, the global degrees of freedom of each rod are augmented with a local set which constitutes an SEA subsystem. As explained in section 3.1, the two SEA subsystems are not directly coupled for the present case, since the hierarchical functions which are employed correspond to the blocked modes of each rod—this implies that the coupling loss factors which appear in equation (44) are set to zero.

Figure 13:
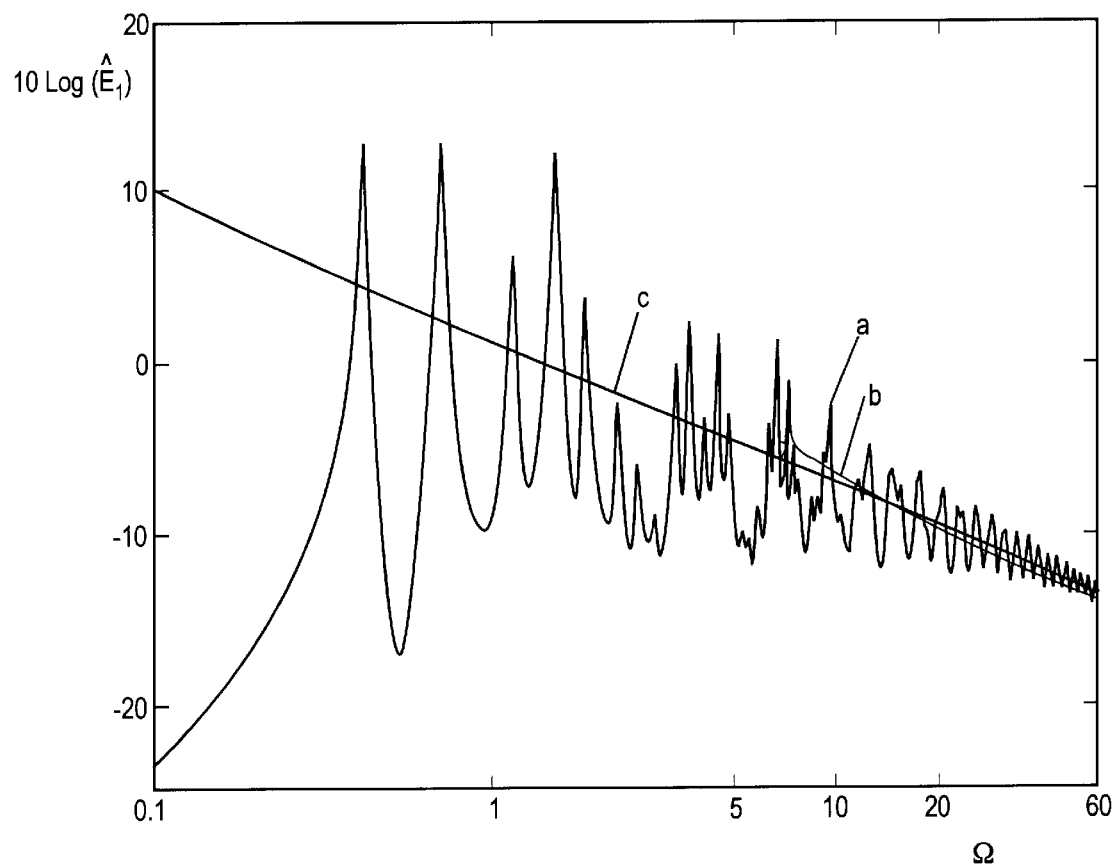
FIG. 13 is a graph of the non-dimensional energy in rod 1 of FIG. 6 for the third example system and shows the responses of the dynamic stiffness method (a), the present hybrid method (b), and the conventional SEA (c)
Figure 14:
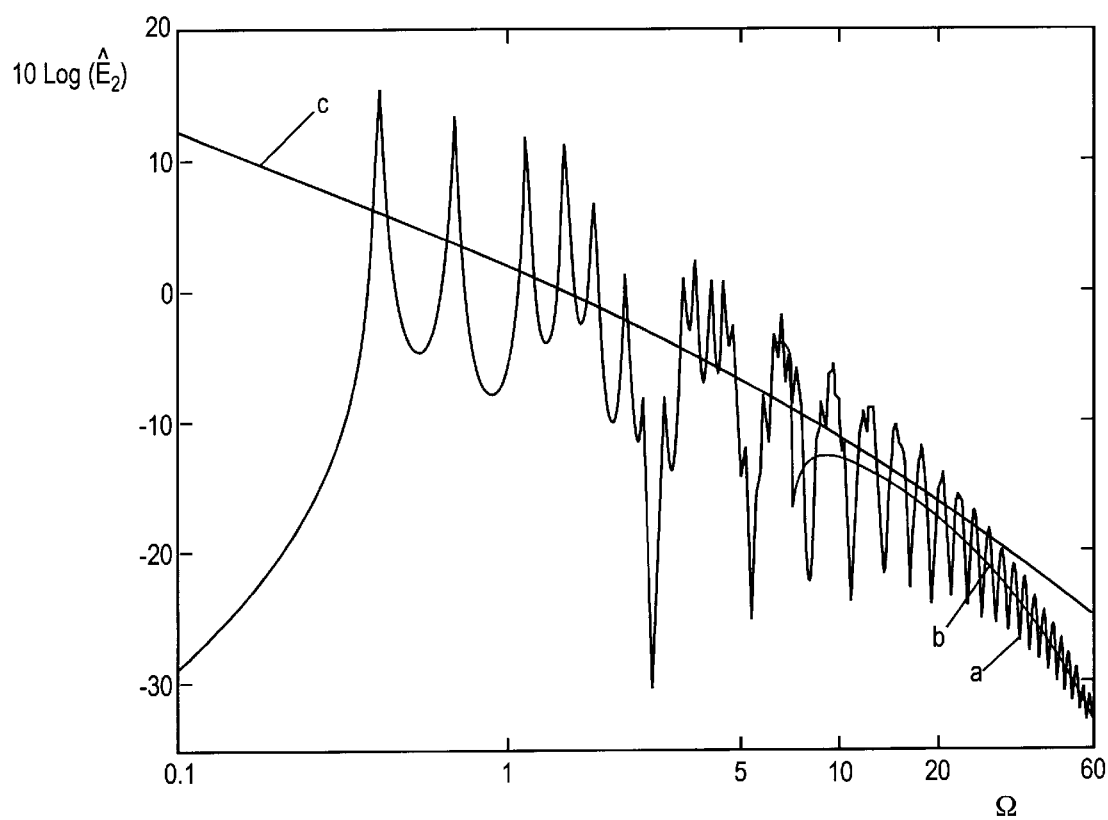
FIG. 14 is a graph of the non-dimensional energy in rod 2 of FIG. 6 for the third example system and shows the responses of the dynamic stiffness method (a), the present hybrid method (b), and the conventional SEA (c)

Computed results for the energy of the system are shown in FIGS. 13 and 14. It is clear that the present method gives a very accurate response prediction for $\Omega<8$ and a good smoothed approximation for $\Omega>8$. The SEA result which is shown in FIG. 14 clearly contains a bias which is not evidenced in the present approach—the cause of this bias can be traced to the occurrence of low modal overlap and the consideration of point loading, rather than rain-on-the-roof forcing. For $\Omega>8$, the results yielded by the present method are not affected by the number of hierarchical terms employed in the global analysis, so that the same results are yielded by a single degree-of-freedom model (consisting of the displacement of the middle node) which contains no hierarchical terms. In contrast, a conventional hierarchical finite element model of the system would require around 105 degrees of freedom to fully capture the modes which lie below $\Omega=60$.

COMPUTER APPLICATION

Figure 15:
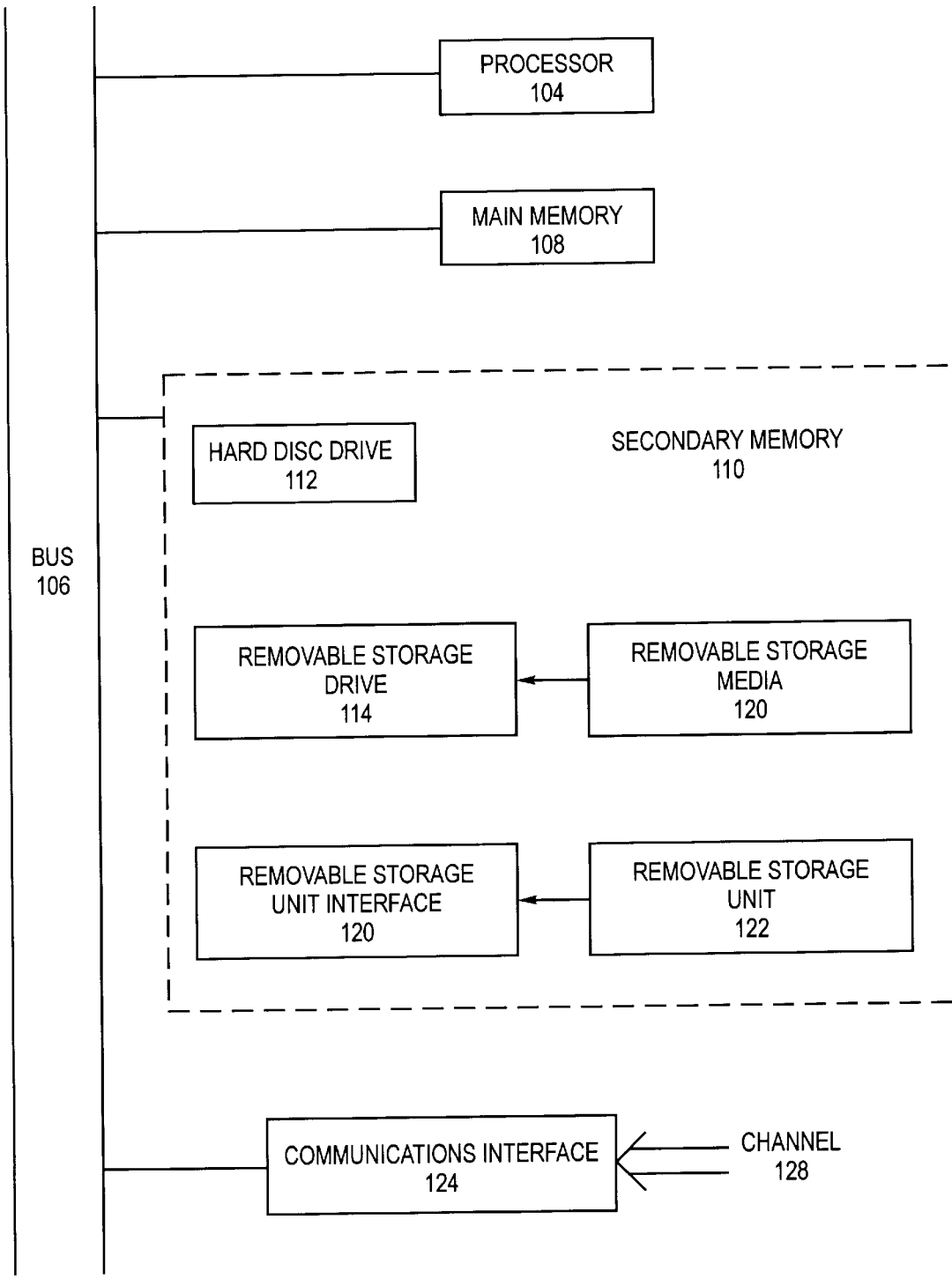

The various relevant aspects, items, entities, and functions described above and/or illustrated in block diagram form may be implemented using hardware, software or a combination thereof and may be implemented in a computer system or other processing system. In fact, in one embodiment, these elements are implemented using a computer system capable of carrying out the functionality described with respect thereto. An example computer system 102 is shown in FIG. 15. The computer system 102 includes one or more processors, such as processor 104. The processor 104 is connected to a communication bus 106. Various software embodiments are described in terms of this example computer system. After reading this description, it will become apparent to a person skilled in the relevant art how to implement the invention using other computer systems and/or computer architectures.

Computer system 102 also includes a main memory 108, preferably random access memory (RAM), and can also include a secondary memory 110. The secondary memory 110 can include, for example, a hard disk drive 112 and/or a removable storage drive 114, representing a floppy disk drive, a magnetic tape drive, an optical disk drive, etc. The removable storage drive 114 reads from and/or writes to a removable storage medium 118 in a well known manner. Removable storage media 118, represents a floppy disk, magnetic tape, optical disk, etc. which is read by and written to by removable storage drive 114. As will be appreciated, the removable storage media 118 includes a computer usable storage medium having the stored therein computer software and/or data.

In alterative embodiments, secondary memory 110 may include other similar means for allowing computer programs or other instructions to be loaded into computer system 102. Such means can include, for example, a removable storage unit 122 and an interface 120. Examples of such can include a program cartridge and cartridge interface (such as that found in video game devices), a removable memory chip (such as an EPROM, or PROM) and associated socket, and other removable storage units 122 and interfaces 120 which allow software and data to be transferred from the removable storage unit 118 to computer system 102.

Computer system 102 can also include a communications interface 124. Communications interface 124 allows software and data to be transferred between computer system 102 and external devices. Examples of communications interface 124 can include a modem, a network interface (such as an Ethernet card), a communication sport, a PCMCIA slot and card, etc. Software and data transferred via communications interface 124 are in the form of signals which can be electronic, electromagnetic, optical or other signals capable of being received by communications interface 124. These signals are provided to communications interface via a channel 128. This channel 128 carries signals and can be implemented using a wireless medium, wire or cable, fiber optics, or other communications medium. Some examples of a channel can include a phone line, a cellular phone link, an RF link, a network interface, and other communications channels.

In this document, the terms "computer program medium" and "computer usable medium" are used to generally refer to media such as removable storage device 118, a hard disk installed in hard disk drive 112, and signals on channel 128. These computer program products are means for providing software to computer system 102.

Computer programs (also called computer control logic) are stored in main memory and/or secondary memory 110. Computer programs can also be received via communications interface 124. Such computer programs, when executed, enable the computer system 102 to perform the features of the present invention as discussed herein. In particular, the computer programs, when executed, enable the processor 104 to perform the features of the present invention. Accordingly, such computer programs represent controllers of the computer system 102.

In an embodiment where the elements are implemented using software, the software may be stored in a computer program product and loaded into computer system 102 using removable storage drive 114, hard drive 112 or communications interface 124. The control logic (software), when executed by the processor 104, causes the processor 104 to perform the functions of the invention as described herein.

In another embodiment, the elements are implemented primarily in hardware using, for example, hardware components such as application specific integrated circuits (ASICs). Implementation of the hardware state machine so as to perform the functions described herein will be apparent to persons skilled in the relevant art(s). In yet another embodiment, elements are implemented using a combination of both hardware and software.

Although this invention has been described in terms of preferred embodiments, other embodiments apparent to those of ordinary skill in the art are also within the scope of this invention. Accordingly, the scope of this invention is intended to be defined only by the claims that follow.

What is claimed:

1. A computer program media, embodying a program of instructions executable by a computer to perform method steps to enable the computer to simulate a structural-acoustic system to determine the dynamic response of the structural-acoustic system over a broad range of frequencies, the method comprising the steps of:

wavenumber partitioning a design of the structural-acoustic system into large-scale behavior and small-scale behavior;

deterministically determining the large-scale global behavior associated with long wavelength deformations and low wavenumbers;

statistically determining the small-scale local behavior associated with short wavelength deformations and high wavenumbers; and predicting sound, vibration and stress response levels and quantitatively evaluating design changes to modify those response levels for the structural-acoustic system based on results from said deterministical and statistical steps.

2. The computer program media of claim 1, further including the step of combining the determined large-scale behavior and small-scale behavior so as to form a total dynamic response.

3. The computer program media of claim 1, wherein the large-scale behavior is global mode behavior and the small-scale behavior is local mode behavior.

4. The computer program media of claim 3, wherein the global mode behavior is determined by a method selected from the group consisting of dynamic stiffness analysis, finite element analysis or component mode synthesis.

5. The computer program media of claim 3, wherein the local mode behavior is determined by a method selected from the group consisting of statistical energy analysis, wave intensity analysis or vibration conductivity analysis.

6. The computer program media of claim 1, wherein some of the partitioned small-scale behavior may be determined deterministically during the determination of the large-scale behavior.

7. The computer program media of claim 1, wherein the small-scale behavior includes local mode groups defined by physical substructure boundaries.

8. The computer program media of claim 3, wherein the local mode behavior and global mode behavior are interrelated.

9. The computer program media of claim 8, wherein the global mode behavior includes a global dynamic stiffness matrix, and the global dynamic stiffness matrix includes an effective dynamic stiffness contribution from local aspects.

10. The computer program media of claim 9, wherein the effective dynamic stiffness contribution from small-scale behavior is treated as effective global mode damping or effective global mode mass based, at least partially, on the assumption that weak coupling exists between local modes.

11. The computer program media of claim 8, wherein the effective dynamic stiffness contribution from local mode behavior is expressed by an equation selected from the group consisting of $$(\mathbf{D}_{gl}\mathbf{D}_{ll}^{-1}\mathbf{D}_{gl}^T)_{mn} =$$

$$-i(\pi\omega^3/2)\sum_{r=1}^{N_S} j_{rmn}^2 v_r \text{ or } (\mathbf{D}_{gl}\mathbf{D}_{ll}^{-1}\mathbf{D}_{gl}^T)_{mn} = -\omega^2 \sum_{r=1}^{N_S}\sum_{k=1}^{N_r'} j_{rmn}^2(k).$$

12. The computer program media of claim 8, wherein the effective dynamic stiffness contribution from local mode behavior is expressed by an equation selected from the group consisting of $$(\mathbf{D}_{gl}\mathbf{D}_{ll}^{-1}\mathbf{D}_{gl}^T)_{mn} = \sum_{j=1}^{N_l}\sum_{k=1}^{N_l}(\mathbf{D}_{gl})_{mj}(\mathbf{D}_{ll}^{-1})_{jk}(\mathbf{D}_{gl})_{nk},$$

$$(\mathbf{D}_{gl}\mathbf{D}_{ll}^{-1}\mathbf{D}_{gl}^T)_{mn} = \sum_{j=1}^{N_l}(\mathbf{D}_{gl})_{mj}(\mathbf{D}_{gl})_{nj}[\omega_j^2(1+i\eta_j)-\omega^2]^{-1}, \text{ or }$$

$$(\mathbf{D}_{gl}\mathbf{D}_{ll}^{-1}\mathbf{D}_{gl}^T)_{mn} = \sum_{r=1}^{N_S}\sum_{k=1}^{N_r'}(\mathbf{D}_{gl})_{mj(k,r)}(\mathbf{D}_{gl})_{nj(k,r)}[(\omega_k^r)(1+i\eta_k^r)-\omega^2]^{-1}.$$

13. The computer program media of claim 8, wherein the global mode behavior includes an effective local load contribution that represents loads applied to local modes, the effective local load contribution determined based, at least in part, on assumption of weak coupling between local modes.

14. The computer program media of claim 13, wherein a simple closed form approximate expression for the effective local load contribution is expressed by an equation selected from the group consisting of $$|(\mathbf{D}_{gl}\mathbf{D}_{ll}^{-1}\mathbf{F}^l)_m|^2 = \sum_{r=1}^{N_S}\langle|F_{j(k,r)}^l|^2\rangle_k\left\{\langle j_{rmn}^2/2\eta_k^r\rangle_k\omega\pi v_r + \sum_{k=1}^{N_r'}j_{rmn}^2(k)\right\}, \text{ or }$$

$$(\mathbf{D}_{gl}\mathbf{D}_{ll}^{-1}\mathbf{F}^l)_m = \sum_{r=1}^{N_S}-\omega^2\int_{V_r}\rho(\mathbf{x})\phi_m^{gT}(\mathbf{x})\mathbf{u}_r^B(\mathbf{x})d\mathbf{x}, \mathbf{u}_r^B(\mathbf{x}) = \sum_{k=1}^{N_r}q_{j(k,r)}^{lB}\phi_{j(k,r)}^l(\mathbf{x}).$$

15. The computer program media of claim 8, wherein the local mode behavior includes an effective power input contribution arising from the global mode behavior, the power input contribution based, at least in part, on assumption of weak coupling between local modes.

16. The computer program media of claim 15, wherein the power input arising from the global mode response is represented by the following equation:

$$P_r^g = (\omega^4 \pi v_r/4)\sum_{m=1}^{N_g}\sum_{n=1}^{N_g}j_{rmn}^2 q_m q_n^*.$$

17. The computer program media of claim 3, wherein the global mode behavior is determined before the local mode behavior is known.

18. The computer program media of claim 1, wherein the global mode behavior is represented by the following equation:

$$(D_{gg}-D_{gl}D_{ll}^{-1}D_{gl}^T)q^g = F^g - D_{gl}D_{ll}^{-1}F^l.$$

19. The computer program media of claim 1, wherein the local mode behavior is represented by the following equations:

$$\omega\eta_r E_r + \omega\sum_{s=1}^{N_S}\eta_{rs}v_r(E_r/v_r - E_s/v_s) = P_r, r = 1, 2, \ldots, N_S.$$

20. A computer program media, embodying a program of instructions executable by a computer to perform method steps to enable the computer to stimulate a structural-acoustic system to determine the dynamic response of the structural-acoustic system over a broad range of frequencies, the method comprising the steps of:

wavenumber partitioning a design of the structural-acoustic system into a global equation of motion and local equation of motion, the global equation of motion having at least one effective local contribution, the local equation of motion having at least one effective global contribution;

computing global equation of motion without considering the at least one local contribution;

first formulating global equation of motion including at the least one local contribution;

deterministically solving the global equation of motion for global response using deterministic methods;

second formulating local equation of motion including at the least one global contribution;

statistically solving local equation of motion for local response using statistical engineering analysis; and predicting sound, vibration and stress response levels and quantitatively evaluating design changes to modify those response levels for the structural-acoustic system based on results from said deterministical and statistical steps.

21. The computer program media of claim 20, further including the step of combining the global response and local response so as to form a total dynamic response.

22. The computer program media of claim 20, wherein the global equation of motion relates to long wavelength deformations of the design and the local equation of motion relates to short wavelength deformations of the design.

23. The computer program media of claim 20, wherein the global equation of motion is determined by a method selected from the group consisting of dynamic stiffness analysis, finite element analysis or component mode synthesis.

24. The computer program media of claim 20, wherein the local mode response is determined by a method selected from the group consisting of statistical energy analysis, wave intensity analysis or vibration conductivity analysis.

25. The computer program media of claim 20, wherein the computing, first formulating, deterministically solving, second formulating and statistically solving steps are repeated in an iterative process.

26. The computer program media of claim 25, further including the step of controlling the way that the local equation of motion is determined so that the computing, first formulating, deterministically solving, second formulating and statistically solving steps are iterated until the local response converges within a predetermined accuracy.

27. The computer program media of claim 26, wherein the step of controlling includes determining the amount of the local equation of motion that is determined deterministically and statistically.

28. The computer program media of claim 20, wherein the determination of the global response is repeated in an iterative process alone, or in conjunction with a repeated iterative process of the computing, first formulating, deterministically solving second formulating and statistically solving steps.

29. The computer program of claim 25, further including a substructuring step, the substructuring step is repeated as an iterative process in conjunction with the iterative process of the computing, first formulating, deterministically solving, second formulating and statistically solving steps.

30. The computer program media of claim 20, wherein some of the partitioned small-scale behavior may be determined deterministically during the determination of the global response.

31. The computer program media of claim 20, wherein the small-scale behavior includes local mode groups defined by physical substructure boundaries.

32. A method for enabling a computer to simulate a structural-acoustic system to determine the dynamic response of the structural-acoustic system over a broad range of frequencies, the method comprising the steps of:

wavenumber partitioning a design of the structural-acoustic system into large-scale behavior and small-scale behavior;

deterministically determining the large-scale global behavior associated with long wavelength deformations and low wavenumbers;

statistically determining the small-scale local behavior associated with short wavelength deformations and high wavenumbers; and predicting sound, vibration and stress response levels and quantitatively evaluating design changes to modify those response levels for the structural-acoustic system based on results from said deterministical and statistical steps.

* * * * *